(12) United States Patent
Ota et al.

(10) Patent No.: US 10,026,800 B2
(45) Date of Patent: Jul. 17, 2018

(54) LIGHT EMITTING DEVICE AND ELECTRONIC APPARATUS

(71) Applicant: SEIKO EPSON CORPORATION, Tokyo (JP)

(72) Inventors: Hitoshi Ota, Shiojiri (JP); Ryoichi Nozawa, Tatsuno-machi (JP); Takeshi Nomura, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/485,753

(22) Filed: Apr. 12, 2017

(65) Prior Publication Data

US 2017/0221980 A1  Aug. 3, 2017

Related U.S. Application Data

(63) Continuation of application No. 14/167,148, filed on Jan. 29, 2014, now Pat. No. 9,653,489.

(30) Foreign Application Priority Data

Feb. 7, 2013  (JP) ................................. 2013-022026

(51) Int. Cl.
H01L 27/32 (2006.01)
H01L 27/12 (2006.01)

(52) U.S. Cl.
CPC ........ *H01L 27/3276* (2013.01); *H01L 27/124* (2013.01); *H01L 27/3206* (2013.01); *H01L 27/3246* (2013.01); *H01L 27/3262* (2013.01); *H01L 27/3297* (2013.01)

(58) Field of Classification Search
CPC ............. H01L 27/3276; H01L 27/3297; H01L 33/387
See application file for complete search history.

(56) References Cited

U.S. PATENT DOCUMENTS

| 5,822,028 A | 10/1998 | Miyawaki |
| 6,081,305 A | 6/2000 | Sato et al. |
| 6,580,094 B1 | 6/2003 | Yamazaki et al. |
| 2002/0033790 A1 | 3/2002 | Sato et al. |
| 2003/0201448 A1 | 10/2003 | Yamazaki et al. |

(Continued)

FOREIGN PATENT DOCUMENTS

| JP | H9-114398 A | 5/1997 |
| JP | H10-335069 A | 12/1998 |

(Continued)

OTHER PUBLICATIONS

Apr. 26, 2016 Office Action Issued in U.S. Appl. No. 14/167,148.

(Continued)

*Primary Examiner* — Asok K Sarkar
*Assistant Examiner* — Grant Withers
(74) *Attorney, Agent, or Firm* — Oliff PLC

(57) ABSTRACT

There is provided a light emitting device including: a semiconductor substrate; a plurality of pixel circuits that is disposed in a display region of the semiconductor substrate; a first wiring that is formed of a conductive material so as to be supplied with a predetermined electric potential; and a plurality of first contact portions that is formed of a conductive material so as to connect the semiconductor substrate and the first wiring. The plurality of first contact portions and the first wiring are provided in the display region.

20 Claims, 22 Drawing Sheets

(56) References Cited

U.S. PATENT DOCUMENTS

| | | |
|---|---|---|
| 2004/0012058 A1 | 1/2004 | Aoki |
| 2006/0017672 A1 | 1/2006 | Aoki |
| 2010/0264822 A1 | 10/2010 | Aoki |

FOREIGN PATENT DOCUMENTS

| | | |
|---|---|---|
| JP | 2001-195016 A | 7/2001 |
| JP | 2001-209345 A | 8/2001 |
| JP | 2004-062160 A | 2/2004 |
| JP | 2006-065284 A | 3/2006 |
| JP | 2012-083765 A | 4/2012 |

OTHER PUBLICATIONS

Oct. 20, 2016 Office Action Issued in U.S. Appl. No. 14/167,148.
Feb. 15, 2017 Notice of Allowance issued in U.S. Appl. No. 14/167,148.

LIGHT EMITTING DEVICE AND ELECTRONIC APPARATUS

CROSS REFERENCE

This application is a Continuation Application of U.S. patent application Ser. No. 14/167,148, filed Jan. 29, 2014, which claims the benefit of priority of Japanese Patent Application No. 2013-022026, filed Feb. 7, 2013. The entire disclosures of both applications are expressly incorporated by reference herein.

BACKGROUND

1. Technical Field

The present invention relates to a light emitting device and an electronic apparatus.

2. Related Art

In recent years, various kinds of light emitting devices, which employ a light emitting element such as an organic light emitting diode (hereinafter referred to as an "OLED"), have been proposed. The light emitting devices are generally configured such that pixel circuits including transistors supplying current to the light emitting element and the like are provided to correspond to pixels of an image to be displayed. In such a configuration, when a data signal of an electric potential corresponding to the gray level of the pixel is applied to a gate of the transistor, the transistor supplies current, which corresponds to a voltage between the gate and the source, to the light emitting element. Thereby, the light emitting element emits light with a luminance corresponding to the gray level.

For most light emitting devices, there is a demand to decrease the display size and increase the display resolution. In order to achieve both of the decrease in the display size and the increase in the display resolution, it is necessary to decrease the size of the pixel circuit. Therefore, a technique of providing the pixel circuits in for example the semiconductor substrate has been proposed (for example, refer to JP-A-2012-083765).

Meanwhile, in order for the light emitting element to emit light with the luminance corresponding to the gray level, it is necessary to uniformly retain the electric potential at a predetermined electric potential throughout the entire semiconductor substrate on which the pixel circuits including the light emitting elements are provided. However, the electric resistance of the semiconductor substrate is higher than, for example, that of a metal or the like. Hence, in most cases, it is difficult to retain the electric potential at the predetermined electric potential throughout the semiconductor substrate.

When the electric potential of the semiconductor substrate is set to be different from the electric potential which should be properly set, the light emitting element does not emit with an accurate luminance corresponding to the gray level. As a result, there may be a decrease in the display quality of the light emitting device such as occurrence of display unevenness.

SUMMARY

An advantage of some aspects of the invention is to prevent defects in display such as display unevenness from being caused by the electric potential of the semiconductor substrate being set to be different from the electric potential which should be properly set, when the pixel circuits are formed on the semiconductor substrate.

According to an aspect of the invention, there is provided a light emitting device including: a semiconductor substrate; a plurality of pixel circuits that is disposed in a display region of the semiconductor substrate; a first wiring that is formed of a conductive material so as to be supplied with a predetermined electric potential; and a plurality of first contact portions that is formed of a conductive material so as to connect the semiconductor substrate and the first wiring. The plurality of first contact portions and the first wiring are provided in the display region.

According to the aspect of the invention, in the display region in which the plurality of pixel circuits is disposed, the first wiring formed of the conductive material with a low electric resistance is provided, and the first wiring and the semiconductor substrate are connected through the plurality of first contact portions formed of the conductive material with the low electric resistance. Hence, it is possible to set the electric potential of the semiconductor substrate to a predetermined electric potential or an electric potential which can be regarded as a predetermined electric potential throughout the entire area of the display region. Accordingly, compared with the case where the first wiring is not provided or the case where the plurality of first contact portions is not provided, it is possible to uniform the electric potential of the semiconductor substrate. Thereby, by preventing defects in display such as display unevenness from being caused by the electric potential of the semiconductor being set to be different from the electric potential which should be properly set, it is possible to achieve high display quality.

Further, in the above-mentioned light emitting device, it is preferable that the plurality of pixel circuits include a first pixel circuit and a second pixel circuit, the each of the first pixel circuit and the second pixel circuit include a first light emitting element, and a first transistor that supplies current to the first light emitting element, and a source of the first transistor be connected to one of the plurality of first contact portions.

The first transistor supplies current, of which the magnitude corresponds to the voltage between the source and the gate of the first transistor, to the first light emitting element. Then, the light emitting element emits light with the luminance corresponding to the magnitude of the supplied current. Hence, when the electric potential of the source of the first transistor is set to be different from the electric potential which should be properly set, the light emitting element, which is supplied with the current from the first transistor, emits light with a luminance different from the original luminance, and thereby the display quality deteriorates.

According to the aspect, the source of the first transistor is connected to the first contact portion. Hence, it is possible to accurately set the electric potential of the source of the first transistor to the predetermined electric potential. As a result, it is possible to cause the light emitting element to emit light with the accurate luminance corresponding to the gray level.

In addition, in this aspect, all the plurality of pixel circuits may be the first pixel circuit, and some of the plurality of pixel circuits may be the first pixel circuit. In short, the light emitting device may include two or more first pixel circuits.

Further, in the above-mentioned light emitting device, it is preferable that the light emitting device be able to display at least a first color and a second color, the plurality of pixel circuits include a first block corresponding the first color and a second block corresponding the second color, the each of the first display block and the second display block includes at least two pixel circuit, the first display block include the first pixel circuit and the second display block includes the second pixel circuit.

According to the aspect, one first contact portion is provided for each one display block. Thus, it is possible to set the electric potential of the semiconductor substrate to a predetermined electric potential or an electric potential approximate thereto, throughout the entire area of the display region. Thereby, compared with a case where the plurality of first contact portions is not provided, it is possible to uniform the electric potential of the semiconductor substrate. As a result, it is possible to prevent defects in display such as display unevenness from being caused by the electric potential of the semiconductor substrate being set to be different from the electric potential which should be properly set.

Further, in the above-mentioned light emitting device, it is preferable that one of the plurality of first contact portions include a part of a source electrode of the first transistor.

According to the aspect, the source electrode of the first transistor is connected to the first contact portion. Hence, it is possible to accurately set the electric potential of the source of the first transistor to the predetermined electric potential. As a result, it is possible to cause the light emitting element to emit light with the accurate luminance corresponding to the gray level.

Further, in the above-mentioned light emitting device, it is preferable that the display region include a first unitary display region and a second unitary display region, an area of the first unitary display region be equal to an area of the second unitary display region, and the plurality of first contact portions includes a contact portion formed in the first unitary display region and a contact portion formed in the second unitary display region.

According to the aspect, in the display region, the first contact portion is provided for each of the plurality of unitary display regions of which areas are equal to one another. Hence, compared with a case where the first contact portion is provided for each of the regions of which areas are different from one another, it is possible to uniformly set the electric potential of the semiconductor substrate. As a result, it is possible to prevent the display unevenness from occurring.

In addition, in this aspect, the plurality of first contact portions may be periodically disposed in the predetermined direction. For example, when the plurality of pixel circuits is formed in a matrix in the display region, the plurality of first contact portions may be disposed periodically (that is, at predetermined intervals in the row direction or the column direction) in the row direction or the column direction.

Further, in the above-mentioned light emitting device, it is preferable that the light emitting device be able to display at least a first color and a second color, the plurality of pixel circuits includes a first block corresponding the first color and a second block corresponding the second color, and the first display block be disposed in the first unitary display region.

According to the aspect, one first contact portion is provided for each one display block. Thus, it is possible to set the electric potential of the semiconductor substrate to a predetermined electric potential or an electric potential approximate thereto, throughout the entire area of the display region.

Further, in the above-mentioned light emitting device, it is preferable that the semiconductor substrate include a first impurity diffused region in the display region and the plurality of first contact portions be connected to the first impurity diffused region.

Further, in the above-mentioned light emitting device, it is preferable that the plurality of pixel circuits be disposed in a matrix and the plurality of first contact portions be disposed in a matrix with a proportion of one row of first contact portions to two rows of pixel circuits or with a proportion of one column of the first contact portions to two columns of the pixel circuits.

According to the aspect, the first contact portions are disposed with a proportion of one row of the first contact portions to two rows of the pixel circuits or with a proportion of one column of the first contact portions to two columns of the pixel circuits. Hence, compared with a case where the first contact portions are disposed at each row or each column, the number of first contact portions can be reduced by half. Thereby, it is possible to minimize the manufacturing cost of the light emitting device. As a result, it is possible to decrease the size of the pixel circuit and decrease the pitch.

Further, according to the aspect, one first contact portion is provided for every two pixel circuits. Hence, it is possible to set the electric potential of the semiconductor substrate to a predetermined electric potential or an electric potential which can be regarded as a predetermined electric potential throughout the entire area of the display region.

In addition, in the above-mentioned light emitting device, the plurality of pixel circuits may be formed in the matrix shape in the display region and the first impurity diffused region may be continuously formed in the column direction with a proportion of one column of the regions to two columns of the pixel circuits.

Further, in the above-mentioned light emitting device, the plurality of pixel circuits may be formed in the matrix shape in the display region and the first impurity diffused region may be continuously formed in the row direction with a proportion of one row of the regions to two rows of the pixel circuits.

Further, in the above-mentioned light emitting device, it is preferable that the plurality of pixel circuits be disposed in a matrix, the plurality of pixel circuits include a plurality of sets of two pixel circuits formed of a second pixel circuit which has a second light emitting element and a second transistor, and a third pixel circuit which has a third light emitting element and a third transistor and is next to the second pixel circuit in a row direction or a column direction, and a source electrode of the second transistor and a source electrode of the third transistor be connected to one of the plurality of first contact portions.

According to the aspect, when the source electrode of the second transistor and the source electrode of the third transistor are connected to the first contact portion in common, the electric potential of the source of the second transistor and the electric potential of the source of the third transistor are accurately set to the predetermined electric potential. Hence, it is possible to cause the light emitting element, which is provided in the second pixel circuit, and the light emitting element, which is provided in the third pixel circuit, to emit light with the accurate luminance corresponding to the gray level.

Further, according to the aspect, one first contact portion is provided for every two pixel circuits. Hence, it is possible to set the electric potential of the semiconductor substrate to a predetermined electric potential or an electric potential which can be regarded as a predetermined electric potential throughout the entire area of the display region.

Further, it is preferable that the above-mentioned light emitting device further include: a second wiring that is formed of a conductive material so as to be supplied with the predetermined electric potential; and a plurality of second contact portions that is formed of a conductive material so as to connect the semiconductor substrate and the second wiring. The plurality of second contact portions and the second wiring are provided in an arrangement region, the arrangement region being a part or the entirety of a peripheral region surrounding the display region.

According to the aspect, in the arrangement region in a part or the entirety of the peripheral region surrounding the display region, the second wiring formed of the conductive material with the low electric resistance is provided, and the second wiring and the semiconductor substrate are connected through the plurality of second contact portions formed of the conductive material with the low electric resistance.

Hence, in at least the arrangement region and a region which is positioned near the arrangement region in the display region, it is possible to set the electric potential of the semiconductor substrate to the predetermined electric potential or the electric potential approximate thereto. Thereby, compared with a case where the second wiring or the second contact portion is not provided, it is possible to uniform the electric potential of the semiconductor substrate.

In addition, in the above-mentioned light emitting device, as viewed from the direction perpendicular to the semiconductor substrate, the display region may have a quadrangle shape, and the arrangement region may be a region provided along one side, two sides, three sides, or four sides of the four sides of the quadrangle in the peripheral region.

Further, in the above-mentioned light emitting device, it is preferable that the second wiring include a plurality of conductive wiring layers.

According to the aspect, the second wiring includes the plurality of conductive wiring layers. Hence, compared with a case where the second wiring is formed of a single conductive wiring layer, it is possible to minimize the electric resistance of the second wiring.

Further, in the above-mentioned light emitting device, it is preferable that the semiconductor substrate include a second impurity diffused region in the arrangement region and the plurality of second contact portions be connected to the second impurity diffused region.

In addition, according to another aspect of the invention, other than the light emitting device, there is provided an electronic apparatus including the light emitting device. Typical examples of the electronic apparatus may include display apparatuses such as a head mount display (HMD) and an electronic viewfinder.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, the embodiments for carrying out the invention will be described with reference to the accompanying drawings.

A. First Embodiment

Figure 1:
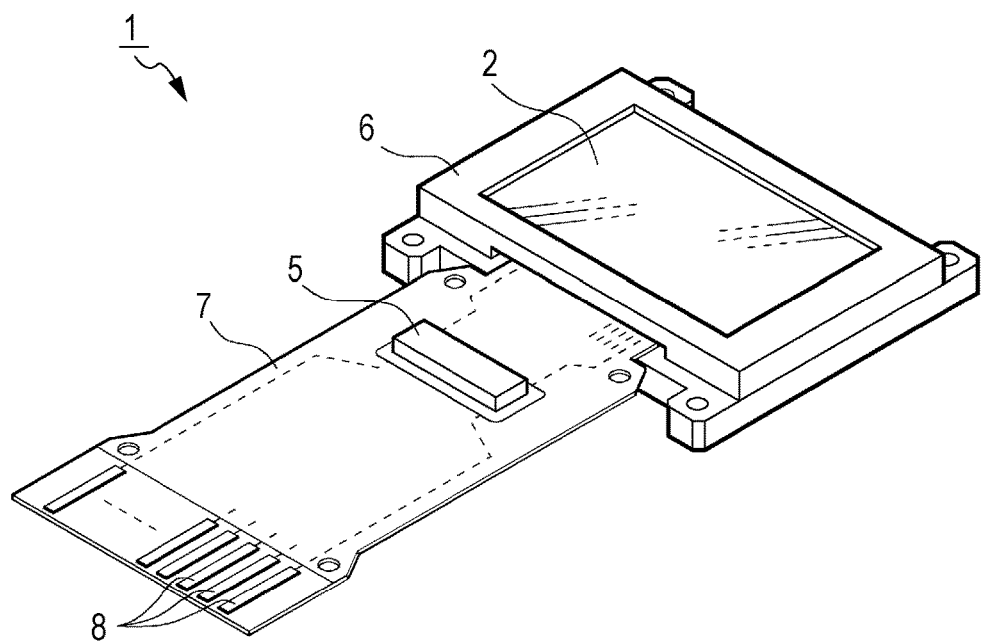
FIG. 1 is a perspective view illustrating a configuration of a light emitting device according to a first embodiment.

FIG. 1 is a perspective view illustrating a configuration of a light emitting device 1 according to an embodiment of the invention.

As shown in FIG. 1, the light emitting device 1 includes a display panel 2 and a control circuit 5 that controls an operation of the display panel 2.

The display panel 2 includes a plurality of pixel circuits and a driving circuit that drives the pixel circuit. In the embodiment, the plurality of pixel circuits and the driving circuit provided in the display panel 2 are formed on a silicon substrate, and an OLED as an example of the light emitting element is used in the pixel circuit. Further, the display panel 2 is housed in, for example, a casing 6 having a frame shape open toward the display section, and is connected to one end of a flexible printed circuits (FPC) substrate 7.

The control circuit 5 of the semiconductor chip is mounted on the FPC substrate 7 by a chip-on-film (COF) technique, and a plurality of terminals 8 is provided thereon. Thereby, the control circuit 5 is connected to an upper circuit which is not shown in the drawing.

Figure 2:
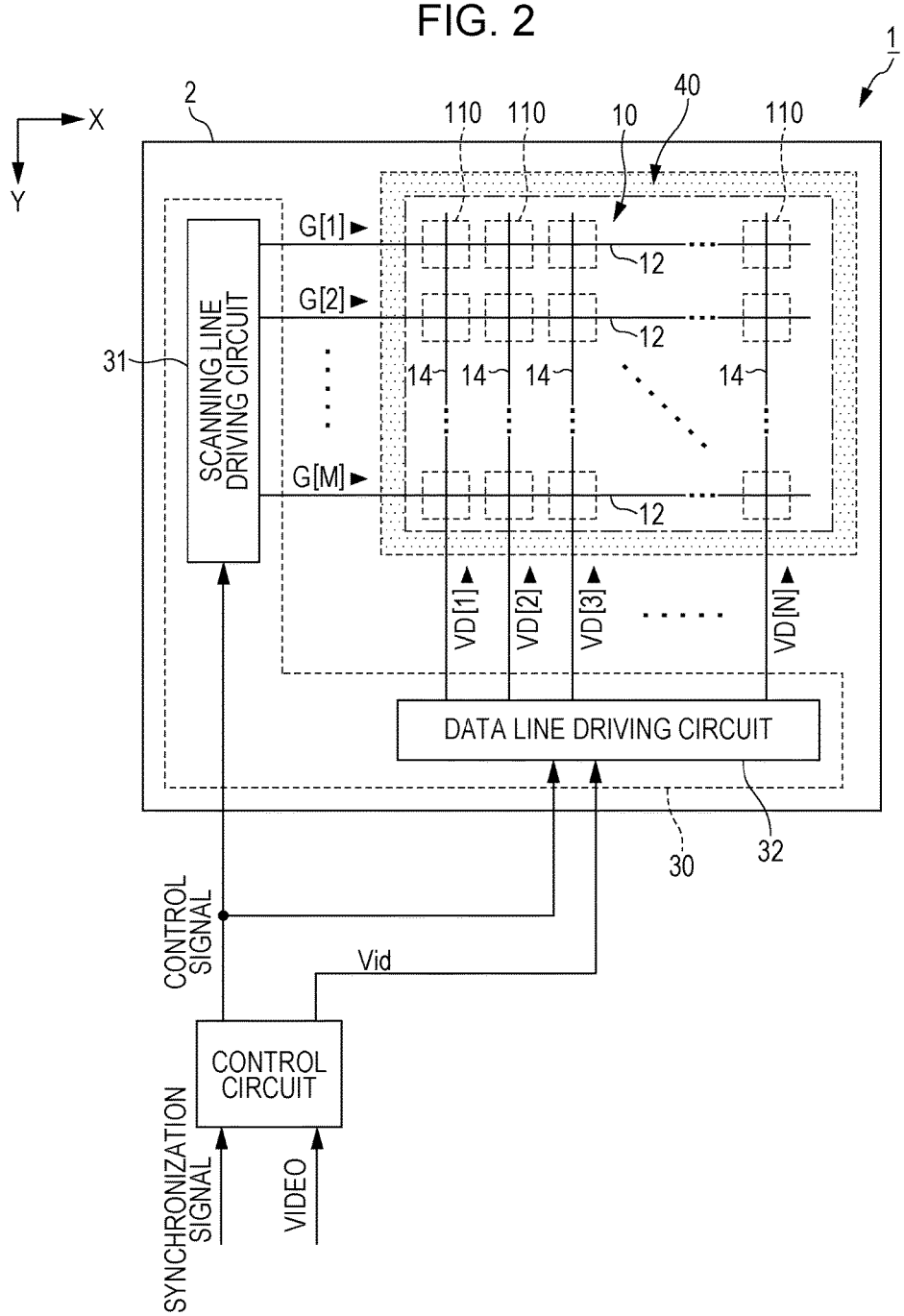
FIG. 2 is a block diagram illustrating the configuration of the light emitting device.

FIG. 2 is a block diagram illustrating the configuration of the light emitting device 1 according to the embodiment. As described above, the light emitting device 1 includes the display panel 2 and the control circuit 5.

The control circuit 5 is supplied with digital image data VIDEO from the upper circuit, which is not shown in the drawing, in synchronization with a synchronization signal. Here, the image data VIDEO is defined as data in which gray levels of pixels of an image to be displayed by the display panel 2 are defined by for example 8 bits. Further, the synchronization signal is defined as a signal including a vertical synchronization signal, a horizontal synchronization signal, and a dot clock signal.

The control circuit 5 generates various control signals on the basis of the synchronization signal so as to supply the signals to the display panel 2, and generates an analog image signal Vid on the basis of the image data VIDEO so as to supply the signal to the display panel 2.

Specifically, the control circuit 5 is provided with a look-up table. In the table, the electric potentials, which are indicated by the image signal Vid, and the luminances of the light emitting element (OLED 130 to be described later), which is provided in the display panel 2, are associated and stored. Then, the control circuit 5 generates the image signal Vid with reference to the look-up table, and supplies the signal to the display panel 2. The image signal Vid represents the electric potentials corresponding to the luminances of the light emitting element defined by the image data VIDEO.

As shown in FIG. 2, in the display panel 2, the pixel circuits 110 corresponding to the pixels of the image to be displayed are arranged in a matrix in the display region 10. Specifically, in the display region 10, scanning lines 12 with M rows are provided to extend in the horizontal direction (X direction) in the drawing, data lines 14 with N columns are provided to extend in the vertical direction (Y direction) in the drawing and to be electrically insulated from the scanning lines 12 respectively. Then, the pixel circuits 110 are provided to correspond to the intersection portions between the scanning lines 12 with M rows and the data lines 14 with N columns. Hence, in the embodiment, the pixel circuits 110 are arranged in a matrix with M vertical rows and N horizontal columns.

Here, both M and N are natural numbers. In order to distinguish the rows of the matrix of the scanning lines 12 and the pixel circuits 110, the rows are represented by the first row, the second row, the third row, . . . , and the M-th row, in order from the top of the drawing. Likewise, in order to distinguish the columns of the matrix of the data lines 14 and the pixel circuits 110, the columns are represented by the first column, the second column, the third column, . . . , and the N-th column, in order from the left side of the drawing.

In addition, although not shown in FIG. 2, in the display region 10, feeder wires 16 with M rows are provided to extend in the horizontal direction (X direction) and to be electrically insulated from the data lines 14 respectively. In order to distinguish the rows of the feeder wires 16, the rows of the feeder wires 16 are represented by the first row, the second row, the third row, . . . , and the M-th row, in order from the left side of the drawing. Each of the feeder wires 16 with M rows is provided to correspond to each of the scanning lines 12 with M rows.

Further, although not shown in FIG. 2, in a peripheral region 40 surrounding the display region 10, feeder wires 41 are provided. The peripheral region 40 and the feeder wires 41 will be described later.

As shown in FIG. 2, the display panel 2 includes a driving circuit 30 which drives the pixel circuits 110. The driving circuit 30 includes a scanning line driving circuit 31, and a data line driving circuit 32.

Figure 3:
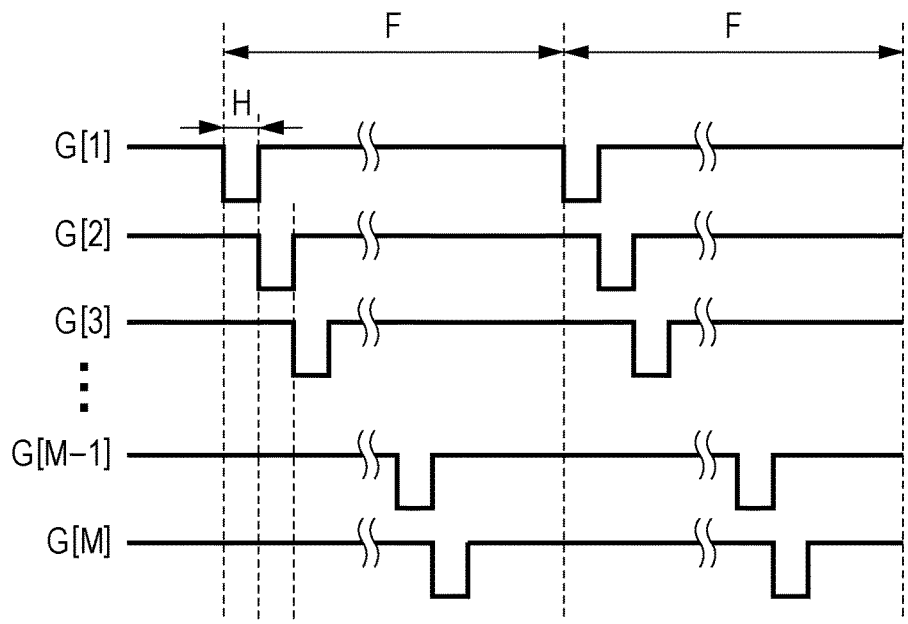
FIG. 3 is a timing chart illustrating an operation of a scanning line driving circuit in the light emitting device.

The scanning line driving circuit 31 is a unit that sequentially scans (selects) the scanning lines 12 at the first to M-th rows in units of rows. Specifically, as shown in FIG. 3, the scanning line driving circuit 31 sets each of scanning signals G[1] to G[M], which are respectively output to the scanning lines 12 at the first to M-th rows, to a predetermined selected electric potential for each horizontal scanning time period H during a time period F of a single frame, thereby sequentially selecting the scanning lines 12 in units of rows. It should be noted that the time period F of the single frame is defined as a time period during which it is necessary for the light emitting device 1 to display an image corresponding to a single cut (coma).

The data line driving circuit 32 generates data voltages VD[1] to VD[N], on the basis of the image signal Vid and the control signal supplied from the control circuit 5, and outputs each voltage to each of the data lines 14 with N columns for each horizontal scanning time period H. The data voltages VD[1] to VD[N] define gray levels which have to be displayed by the pixels corresponding to the pixel circuits 110.

It should be noted that, in the embodiment, the image signal Vid, which is output by the control circuit 5, is an analog signal, but the control circuit 5 may output a digital image signal. In this case, in the data line driving circuit 32, by D/A converting the digital image signal, the data voltages VD[1] to VD[N] may be generated.

Figure 4:
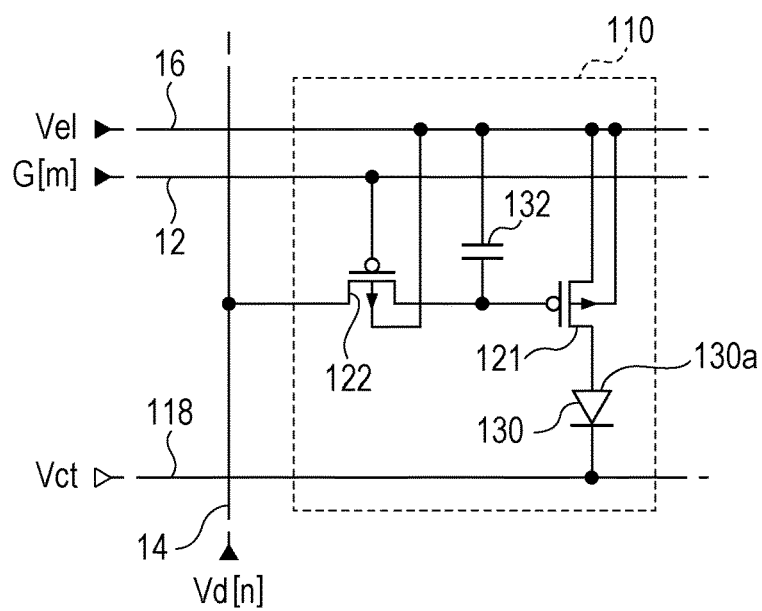
FIG. 4 is a diagram illustrating a pixel circuit in the light emitting device.

FIG. 4 shows an example of an equivalent circuit schematic of the pixel circuit 110. In addition, the pixel circuits 110 have configurations which are electrically the same as one another. Therefore, here, a description will be given of an example of the pixel circuit 110 at the m-th row and n-th column. Here, m is an integer which is equal to or greater than 1 and equal to or less than M, and n is an integer which is equal to or greater than 1 and equal to or less than N.

As shown in FIG. 4, the pixel circuit 110 includes P-channel MOS-type transistors 121 and 122, an OLED 130, and a retentive capacitor 132. The pixel circuit 110 is supplied with the scanning signal G[m] from the scanning line driving circuit 31 through the scanning line 12 at the m-th row.

The gate of the transistor 122 is electrically connected to the scanning line 12 at the m-th row, and one of the source and the drain is electrically connected to the data line 14 at the n-th column. Further, the other one of the source and the drain of the transistor 122 is electrically connected to the gate of the transistor 121 and one of two electrodes of the retentive capacitor 132. That is, the transistor 122 is electrically connected between the gate of the transistor 121 and the data line 14, and controls electric connection between the gate of the transistor 121 and the data line 14.

The source of the transistor 121 is electrically connected to the feeder wire 16 at the m-th row. The feeder wire 16 is supplied with an electric potential Vel (an example of the "predetermined electric potential") which is higher than the electric potential of the power supply in the pixel circuit 110.

Further, the drain of the transistor 121 is electrically connected to an anode 130a of the OLED 130. The transistor 121 functions as a driving transistor that supplies current corresponding to the voltage between the gate and the source of the transistor 121.

In addition, in the following description, a wiring, which is electrically connected to the gate of the transistor 121, may be referred to as a gate electrode of the transistor 121 (specifically, the wiring is defined as a wiring which electrically connects the gate of the transistor 121, the other one of the source and the drain of the transistor 122, and one electrode of the retentive capacitor 132).

Further, a wiring, which is electrically connected to the source of the transistor 121, may be referred to as a source electrode of the transistor 121 (specifically, the wiring is defined as a wiring which connects the source of the transistor 121 and the feeder wire 16).

Furthermore, a wiring, which is electrically connected to the drain of the transistor 121 is referred to as a drain electrode of the transistor 121 (specifically, the wiring is defined as a wiring which electrically connects the drain of the transistor 121 and the anode 130a of the OLED 130).

The display panel 2 in the embodiment is formed on a silicon substrate. Here, the channels of the transistor 121 and the transistor 122 are provided on the silicon substrate. Further, the silicon substrate is supplied with the electric potential Vel. That is, each substrate potential of the transistor 121 and the transistor 122 is the electric potential Vel.

In addition, the sources and the drains of the transistor 121 and the transistor 122 may be changed in accordance with channel types of the transistor 121 and the transistor 122 or relationships between the electric potentials applied to the sources and the drains of the transistors. Further, the transistors may be thin film transistors and may be field-effect transistors.

In the retentive capacitor 132, one electrode of the two electrodes of the retentive capacitor 132 is electrically connected to the gate of the transistor 121, and the other electrode thereof is electrically connected to the feeder wire 16. Hence, the retentive capacitor 132 functions as a retentive capacitor which retains the voltage between the gate and the source of the transistor 121.

It should be noted that the retentive capacitor 132 may employ a capacitor which is parasitic on the gate electrode of the transistor 121, and may employ a capacitor which is formed by interposing an insulation layer between conductive layers different from each other on the silicon substrate.

The anode 130a of the OLED 130 is a pixel electrode which is separately provided in each of the plurality of pixel circuits 110. On the other hand, a cathode of the OLED 130 is a common electrode which is provided in common to all the pixel circuits 110, and is kept at an electric potential Vct which is lower than the electric potential of the power supply in the pixel circuit 110. In the embodiment, a feeder wire 118 corresponds to the common electrode.

The OLED 130 is an element in which a white organic EL layer is interposed between the anode 130a and an optically transparent cathode on the silicon substrate. In addition, the emission side (cathode side) of the OLED 130 can be overlaid with a color filter corresponding to any of R (red), G (green), and B (blue).

In such an OLED 130, when current flows from the anode 130a to the cathode, holes injected from the anode 130a and electrons injected from the cathode are recombined in the organic EL layer, and excitons are generated, thereby generating white light. The white light generated at this time is transmitted through the cathode on a side opposite to the silicon substrate (anode 130a), is colored through the color filter, and is visible on an observer side.

Next, a description will be given of a structure of the pixel circuits 110 provided in the display region 10, a structure of the feeder wires 41 provided in the peripheral region 40, and positions of the pixel circuits 110 and the feeder wires 41 arranged, with reference to FIGS. 5 to 9.

Figure 5:
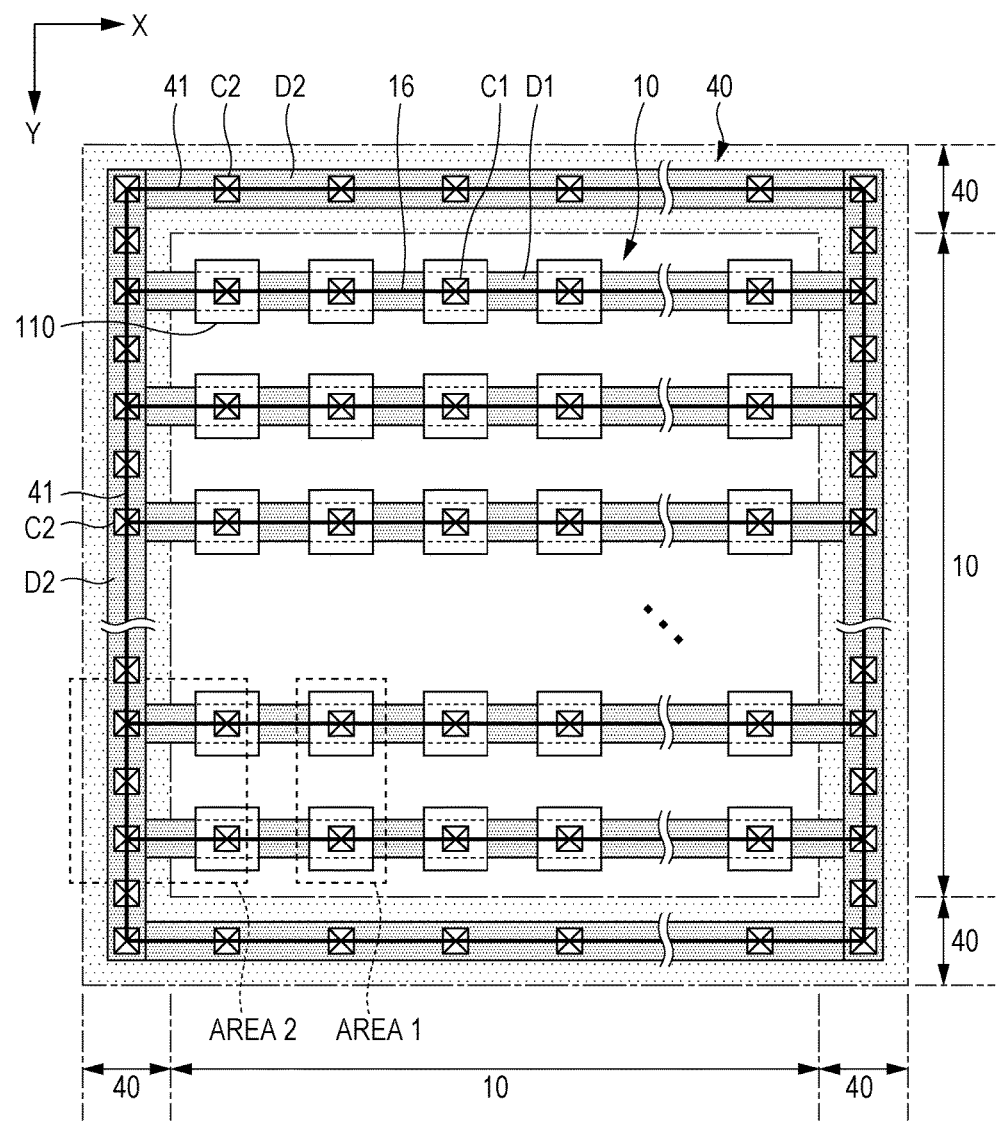
FIG. 5 is an explanatory diagram illustrating a display region and a peripheral region in the light emitting device.

FIG. 5 is a top plan view of the display region 10 and the peripheral region 40, and is a diagram schematically illustrating a relationship of arranged positions of the pixel circuits 110 and the feeder wires 16 provided in the display region 10 and the feeder wires 41 provided in the peripheral region 40. As described above, the display region 10 is a region in which the plurality of pixel circuits 110 is arranged in M rows and N columns, and the peripheral region 40 is a region surrounding the periphery of the display region 10.

As shown in FIG. 5, in the display region 10, the pixel circuits 110 are arranged in a matrix with M vertical rows and N horizontal columns, and the feeder wires 16 with M rows are provided.

Further, in the display region 10, N-type impurity diffused regions D1 with M rows are provided in one-to-one correspondence with the feeder wires 16 with M rows so as to extend in the horizontal direction (X direction) in the drawing.

Furthermore, in the display region 10, M vertical×N horizontal contact portions C1 are provided in one-to-one correspondence with the pixel circuits 110 with M rows and N columns. Each contact portion C1 is formed of a metal such as aluminum or another conductive material so as to connect the feeder wire 16 and the N-type impurity diffused region D1. More specifically, the N contact portions C1 arranged at the m-th row respectively connect the feeder wires 16 arranged at the m-th row and the N-type impurity diffused regions D1 arranged at the m-th row.

That is, the N-type impurity diffused region D1 corresponds to the "first impurity diffused region" provided in the display region 10. The feeder wire 16 corresponds to the "first wiring" supplied with the predetermined electric potential. The contact portion C1 corresponds to the "first contact portion" which connects the first wiring and the first impurity diffused region.

Further, as shown in FIG. 5, in the peripheral region 40, the feeder wires 41 and N-type impurity diffused regions D2 are provided to surround the display region 10. The N-type impurity diffused regions D2 are provided to be connected to each of the N-type impurity diffused regions D1 with M rows. Further, the feeder wires 41 are provided to be connected to each of the feeder wires 16 with M rows. The feeder wires 41 are supplied with the electric potential Vel.

Furthermore, in the peripheral region 40, a plurality of contact portions C2 is provided. Each contact portion C2 is formed of a metal such as aluminum or another conductive material so as to connect the feeder wires 41 and the N-type impurity diffused regions D2.

That is, the N-type impurity diffused region D2 corresponds to the "second impurity diffused region" provided in the peripheral region 40. The feeder wire 41 corresponds to the "second wiring" supplied with the predetermined electric potential. The contact portion C2 corresponds to the "second contact portion" which connects the second wiring and the second impurity diffused region.

The structure of the pixel circuits 110 will be described with reference to FIGS. 6 and 7.

Figure 6:
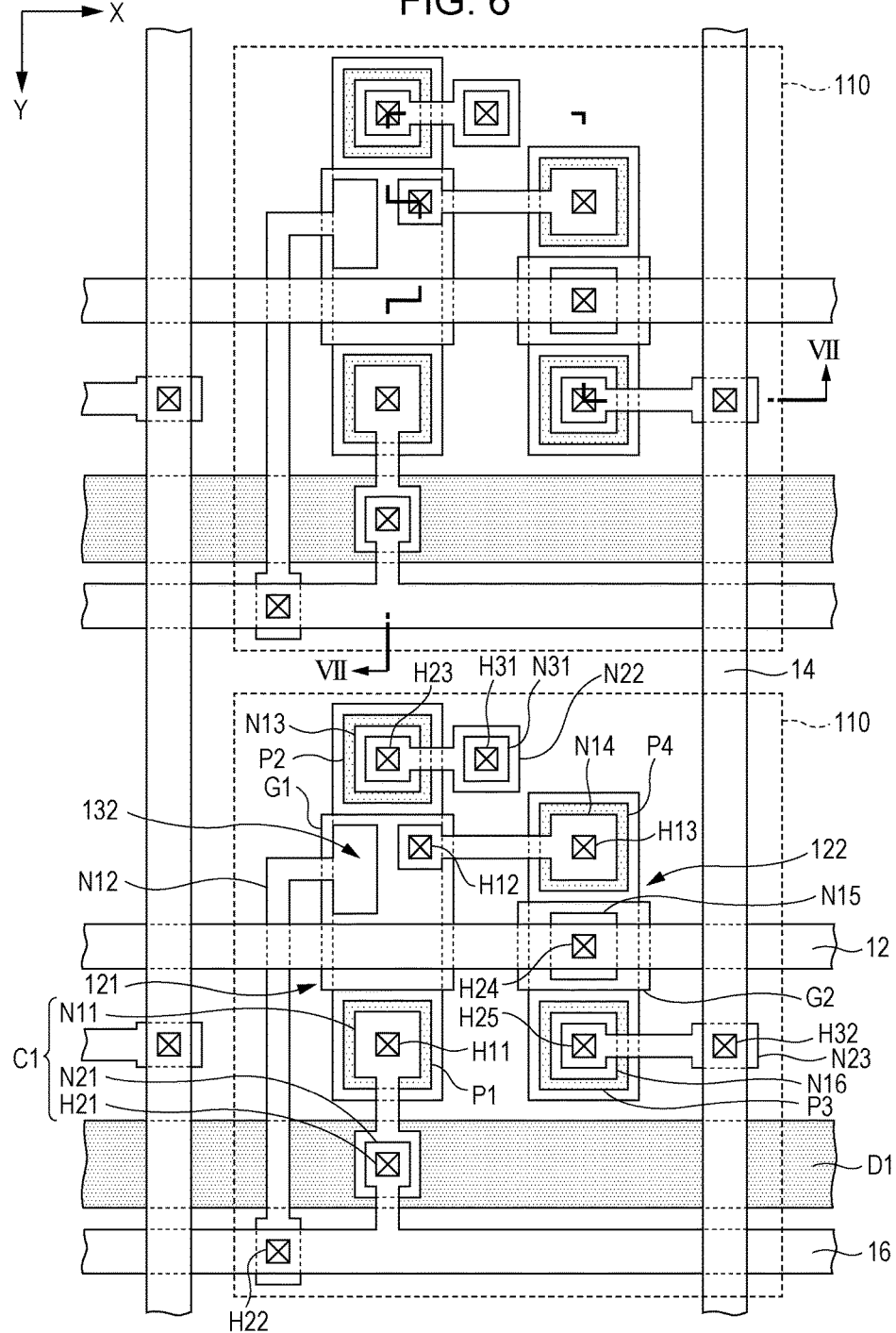
FIG. 6 is a top plan view illustrating a configuration of the pixel circuits in the light emitting device.

FIG. 6 is a top plan view illustrating a configuration of the two pixel circuits 110 which are adjacent to each other in the Y direction, as shown in, for example, the portion Area1 of FIG. 5. It should be noted that FIG. 6 shows wiring structures of the pixel circuits 110 having top emission structures as viewed from the front surface side, but does not show structures, which are formed to be closer to the front surface side than the third conductive wiring layer to be described later, for the sake of simplicity.

Figure 7:
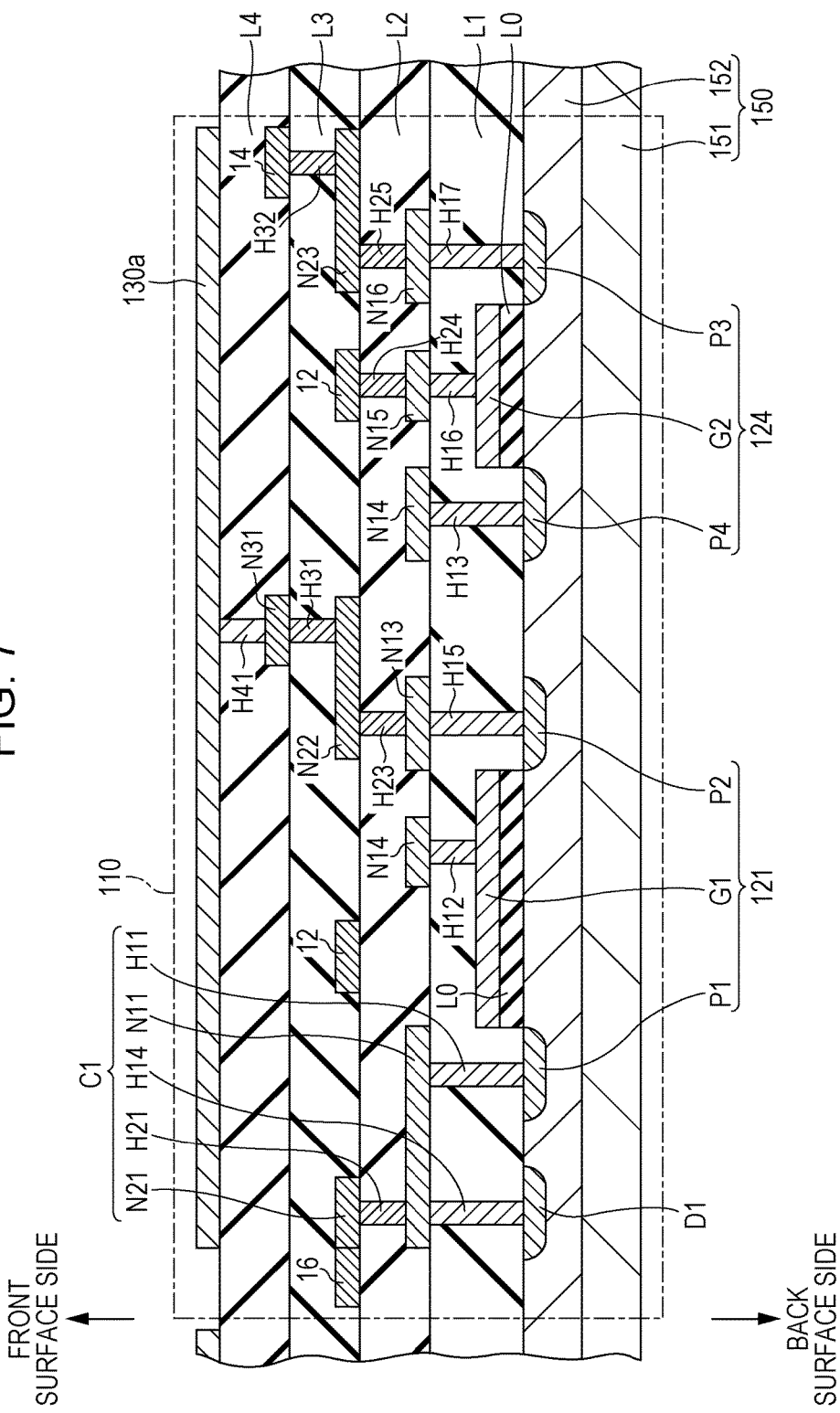
FIG. 7 is a partial cross-sectional view illustrating the configuration of the pixel circuit in the light emitting device.

Further, FIG. 7 is a partial cross-sectional view taken along the line E-e of FIG. 6. FIG. 7 does not show structures, which are formed to be closer to the front surface side than the anode 130a of the OLED 130, for the sake of simplicity.

Here, the "front surface side" indicates a direction in which the anode 130a is provided as viewed from the semiconductor substrate 150 in FIG. 7. In addition, the "back surface side" indicates a direction in which the semiconductor substrate 150 is provided as viewed from the anode 130a.

Further, in the top plan view shown in FIG. 6 and the cross-sectional view shown in FIG. 7, the layers, the members, the regions, and the like may have different scales in order to have recognizable sizes (hereinafter, it is the same for the top plan view and the cross-sectional view given in the present description).

As shown in FIG. 7, the components constituting the pixel circuit 110 are formed on the semiconductor substrate 150. In the embodiment, as the semiconductor substrate 150, a P-type semiconductor substrate is used.

The semiconductor substrate 150 includes a P-type semiconductor layer 151 and an N well 152 which is formed by injecting N-type impurities into the P-type semiconductor layer 151. Specifically, by implanting ions into the P-type semiconductor layer 151 from the front surface side, the N well 152 is formed to cover substantially the entire surface of the front surface side of the semiconductor substrate 150.

Further, the semiconductor substrate 150 includes, in the display region 10, N-type impurity diffused regions, which are formed by injecting N-type impurities into the N well 152, and P-type impurity diffused regions which are formed by injecting P-type impurities into the N well 152. Specifically, on the front surface side of the N well 152, in the display region 10, the N-type impurity diffused region D1 is provided at each row, and four P-type impurity diffused regions P1 to P4 are provided at each pixel circuit 110.

Furthermore, a gate insulation layer L0, which is formed of a non-conductive material, is provided on the surface of the semiconductor substrate 150 (N well 152), and gate nodes G1 and G2, which are formed of a metal such as aluminum or another conductive material, are provided on the surface of the gate insulation layer L0.

As shown in FIGS. 6 and 7, the transistor 121 has the gate node G1, the P-type impurity diffused region P1, and the P-type impurity diffused region P2. The P-type impurity diffused region P1 corresponds to the source of the transistor 121. The P-type impurity diffused region P2 corresponds to the drain of the transistor 121. The gate node G1 corresponds to the gate of the transistor 121.

Further, the transistor 122 has the gate node G2, the P-type impurity diffused region P3, and the P-type impurity diffused region P4. The P-type impurity diffused region P3 corresponds to one of the source and the drain of the transistor 122. The P-type impurity diffused region P4 corresponds to the other one of the source and the drain of the transistor 122. The gate node G2 corresponds to the gate of the transistor 122.

As shown in FIG. 7, a first interlayer insulation layer L1 is provided to cover the semiconductor substrate 150 and the gate node G1 and G2.

A conductive wiring layer, which is formed of a metal such as aluminum or another conductive material, is patterned, on the front surface side of the first interlayer insulation layer L1. Specifically, as the conductive wiring layer, relay nodes N11 to N16 are provided for each pixel circuit 110, on the front surface side of the first interlayer insulation layer L1. Hereinafter, the conductive wiring layer, which is provided on the front surface side of the first interlayer insulation layer L1, may be referred to as a "first conductive wiring layer".

Further, as shown in FIG. 7, interlayer connection portions H11 to H17, which penetrate the first interlayer insulation layer L1, are provided on each pixel circuit 110.

Each interlayer connection portion is provided through a contact hole which is pierced through the interlayer insulation layer, and is a connection wiring (contact plug) which connects the conductive wiring layer on the front surface side of the interlayer insulation layer and the conductive wiring layer on the back surface side thereof. The interlayer connection portion is formed of a metal such as aluminum or another conductive material. The interlayer connection portion is indicated by the sign "x" in the sign "□" in a portion in which different kinds of the wiring layers overlap in FIG. 6.

In addition, in the embodiment, the conductive wiring layer on the front surface side of the interlayer insulation layer and the conductive wiring layer on the back surface side of the interlayer insulation layer are electrically connected through the interlayer connection portions formed of contact plugs. However, by filling the contact hole with a part of the conductive wiring layer on the front surface side, the conductive wiring layer on the front surface side may be directly connected to the conductive wiring layer on the back surface side, and both of them may be electrically connected.

As shown in FIG. 7 (and FIG. 6), the relay node N11 is electrically connected to the P-type impurity diffused region P1 through the interlayer connection portion H11, and is electrically connected to the N-type impurity diffused region D1 through the interlayer connection portion H14. The relay node N13 is electrically connected to the P-type impurity diffused region P2 through the interlayer connection portion H15.

Further, the relay node N14 is electrically connected to the gate node G1 through the interlayer connection portion H12, and is electrically connected to the P-type impurity diffused region P4 through the interlayer connection portion H13. That is, the relay node N14, the interlayer connection portion H12, and the interlayer connection portion H13 corresponds to the gate electrode of the transistor 121.

The relay node N15 is electrically connected to the gate node G2 through the interlayer connection portion H16. The relay node N16 is electrically connected to the P-type impurity diffused region P3 through the interlayer connection portion H17.

Further, as shown in FIG. 6, the first interlayer insulation layer L1 is interposed between the relay node N12 and the gate node G1, whereby the retentive capacitor 132 is formed. That is, the gate node G1 corresponds to one electrode of the retentive capacitor 132, and the relay node N12 corresponds to the other one electrode of the retentive capacitor 132.

As shown in FIG. 7, a second interlayer insulation layer L2 is provided to cover the first conductive wiring layer and the first interlayer insulation layer L1.

A conductive wiring layer, which is formed of a metal such as aluminum or another conductive material, is patterned, on the front surface side of the second interlayer insulation layer L2. Specifically, on the front surface side of the second interlayer insulation layer L2, the scanning line 12 and the feeder wire 16 are provided for each row as the conductive wiring layer, and relay nodes N21 to N23 are provided for each pixel circuit 110. Hereinafter, the conductive wiring layer, which is provided on the front surface side of the second interlayer insulation layer L2, may be referred to as a "second conductive wiring layer".

As shown in FIGS. 6 and 7, interlayer connection portions H21 to H25, which penetrate the second interlayer insulation layer L2, are provided on each pixel circuit 110.

The relay node N21 is connected to the feeder wire 16, and is electrically connected to the relay node N11 through the interlayer connection portion H21. Thereby, the feeder wire 16 is electrically connected to the P-type impurity diffused region P1 through the relay node N21, the interlayer connection portion H21, the relay node N11, and the interlayer connection portion H11. In addition, the feeder wire 16 is electrically connected to the N-type impurity diffused region D1 through the relay node N21, the interlayer connection portion H21, the relay node N11, and the interlayer connection portion H14. As a result, the N-type impurity diffused region D1 and the P-type impurity diffused region P1 are supplied with the electric potential Vel from the feeder wire 16.

The relay node N21, the interlayer connection portion H21, the relay node N11, and the interlayer connection portion H11 corresponds to the source electrode of the transistor 121. Further, the relay node N21, the interlayer connection portion H21, the relay node N11, and the interlayer connection portion H14 corresponds to the contact portion C1.

That is, in the embodiment, the contact portion C1 is connected to the source electrode of the transistor 121. More specifically, the contact portion C1 includes a part of the source electrode of the transistor 121.

In addition, in the embodiment, as viewed from the front surface side, the feeder wire 16 and the N-type impurity diffused region D1 are disposed not to overlap with each other. However, the feeder wire 16 and the N-type impurity diffused region D1 may be disposed to overlap with each other. In this case, the pixel circuit 110 does not have the relay node N21, and the feeder wire 16 may be electrically connected to the relay node N11 through the interlayer connection portion H21.

As shown in FIGS. 6 and 7, the relay node N22 is electrically connected to the relay node N13 through the interlayer connection portion H23. The relay node N23 is electrically connected to the relay node N16 through the interlayer connection portion H25.

Further, the scanning line 12 is electrically connected to the relay node N15 through the interlayer connection portion H24. Hence, the scanning line 12 is electrically connected to the gate node G2. Furthermore, the feeder wire 16 is electrically connected to the relay node N12 through the interlayer connection portion H22. Hence, the relay node N12 is supplied with the electric potential Vel.

As shown in FIG. 7, a third interlayer insulation layer L3 is provided to cover the second conductive wiring layer and the second interlayer insulation layer L2.

A conductive wiring layer, which is formed of a metal such as aluminum or another conductive material, is patterned, on the front surface side of the third interlayer insulation layer L3. Specifically, on the front surface side of the third interlayer insulation layer L3, the data line 14 is provided for each column as the conductive wiring layer, and relay node N31 is provided for each pixel circuit 110. Hereinafter, the conductive wiring layer, which is provided on the front surface side of the third interlayer insulation layer L3, may be referred to as a "third conductive wiring layer".

As shown in FIG. 7 (and FIG. 6), interlayer connection portions H31 and H32, which penetrate the third interlayer insulation layer L3, are provided on each pixel circuit 110.

The relay node N31 is electrically connected to the relay node N22 through the interlayer connection portion H31. Further, the data line 14 is electrically connected to the relay node N23 through the interlayer connection portion H32. Hence, the data line 14 is electrically connected to the P-type impurity diffused region P3.

As shown in FIG. 7, a fourth interlayer insulation layer L4 is provided to cover the third conductive wiring layer and the third interlayer insulation layer L3. A conductive wiring layer, which is formed of a conductive material such as aluminum or indium tin oxide (ITO), is patterned, on the front surface side of the fourth interlayer insulation layer L4, whereby the anode 130*a* of the OLED 130 is formed. The anode 130*a* of the OLED 130 is a separate pixel electrode for each pixel circuit 110, and is connected to the relay node N31 through the interlayer connection portion H41 which penetrates the fourth interlayer insulation layer L4. Hence, the anode 130*a* of the OLED 130 is electrically connected to the P-type impurity diffused region P2. That is, the interlayer connection portion H41, the relay node N31, the interlayer connection portion H31, the relay node N22, the interlayer connection portion H23, the relay node N13, and the interlayer connection portion H15, which electrically connect the anode 130*a* and the P-type impurity diffused region P2, correspond to the drain electrode of the transistor 121.

Further, although not shown in the drawing, a light emitting layer, which is divided for each pixel circuit 110 and is formed of an organic EL material, is laminated on the front surface side of the anode 130*a* of the OLED 130. In addition, a cathode (that is, the feeder wire 118 as a common electrode) as a transparent electrode, which is common to the plurality of pixel circuits 110, is provided to the light emitting layer. That is, the OLED 130 is configured such that the light emitting layer is interposed between the anode and the cathode facing each other, thereby emitting light at the luminance depending on the current which flows from the anode toward the cathode. In the light emitted by the OLED 130, light traveling toward the front surface side, which is a side opposite to the semiconductor substrate 150, is visible as an image to an observer (top emission structure).

In addition, although not shown in the drawing, a sealing material for blocking the light emitting layer from air is provided on the front surface side of the cathode.

Next, the feeder wires 41, the contact portions C2, and the N-type impurity diffused regions D2, which are provided in the peripheral region 40, will be described with reference to FIGS. 8 and 9.

Figure 8:
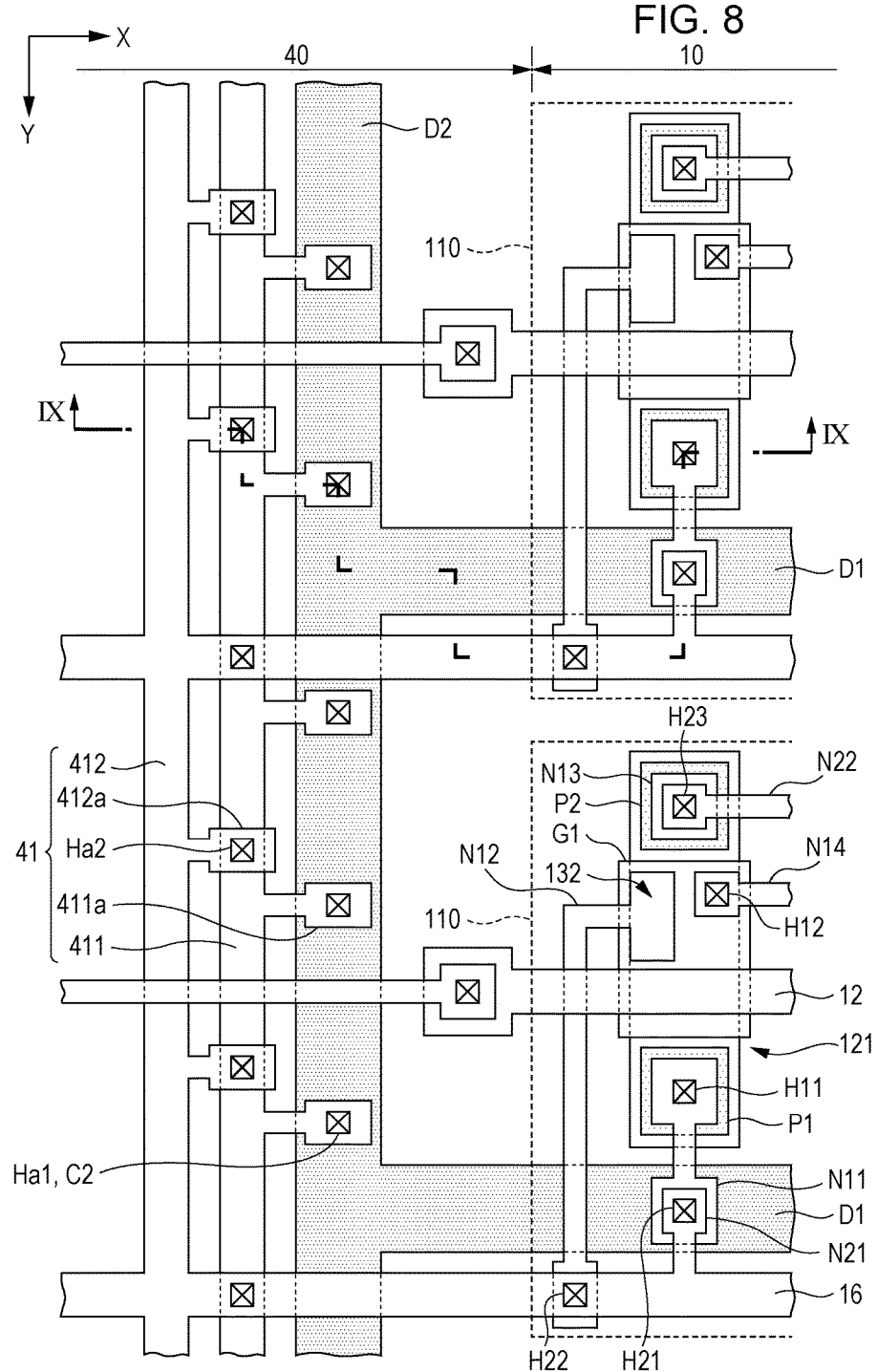
FIG. 8 is a top plan view illustrating a configuration of the peripheral region in the light emitting device.

FIG. 8 is a top plan view illustrating a configuration of a part of the two pixel circuits 110, which are disposed at the end of the display region 10 and are adjacent to each other in the Y direction, and the feeder wire 41, which is provided in the peripheral region 40, as shown in for example a portion Area2 of FIG. 5.

Figure 9:
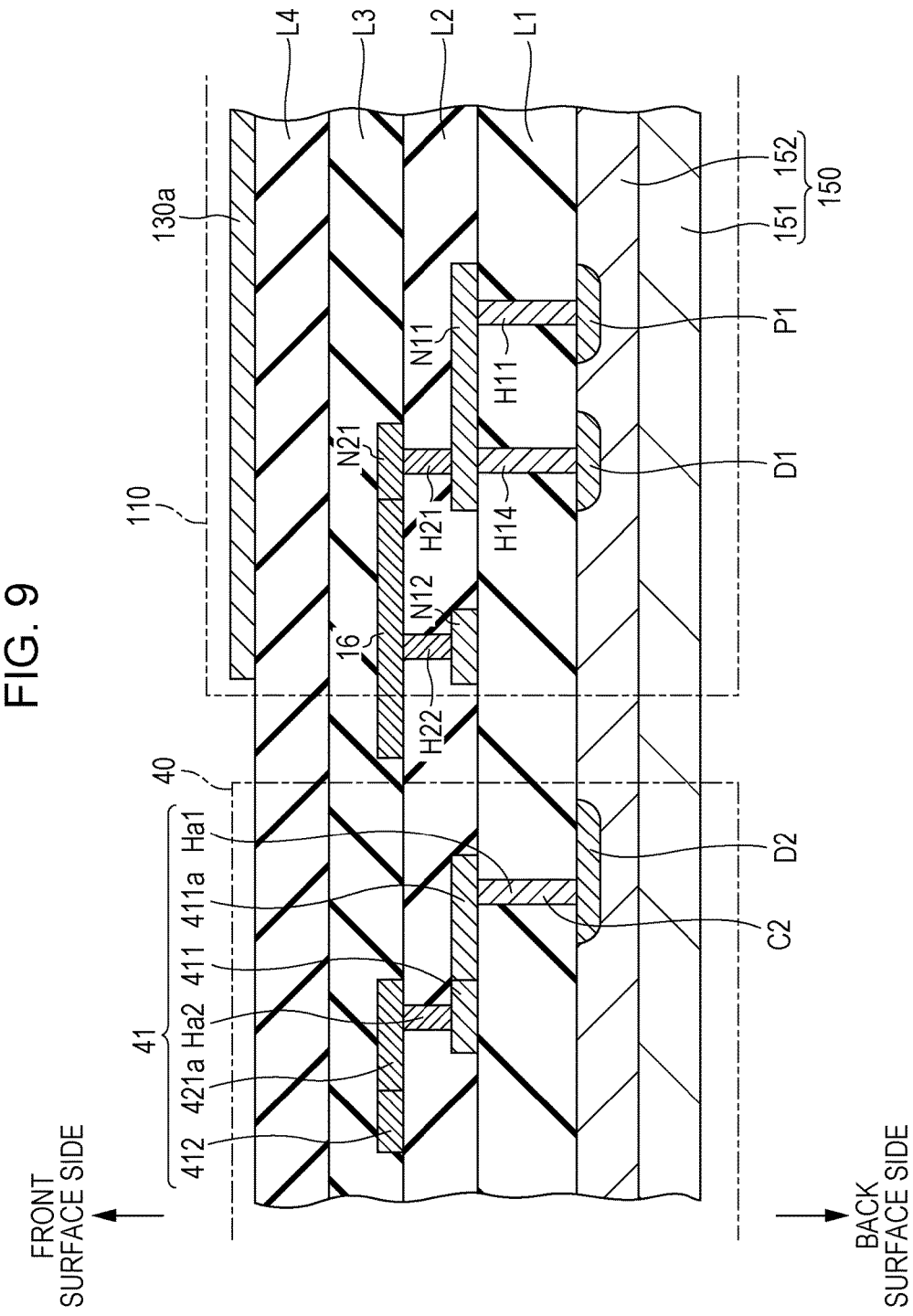
FIG. 9 is a partial cross-sectional view illustrating the configuration of the peripheral region in the light emitting device.

In addition, FIG. 9 is a partial cross-sectional view taken along the line F-f of FIG. 8. FIG. 9 does not show a structure which is formed behind the anode 130a of the OLED 130, in a similar manner to FIG. 7.

As shown in FIGS. 8 and 9, the N-type impurity diffused region D2 is formed by injecting the N-type impurities into the N well 152 in the peripheral region 40 on the semiconductor substrate 150. As described above, the N-type impurity diffused regions D2 are connected to the N-type impurity diffused regions D1.

Further, the first interlayer insulation layer L1 is provided also in the peripheral region 40 on the front surface side of the semiconductor substrate 150, and a feeder wire 411 as the first conductive wiring layer is provided on the front surface side of the first interlayer insulation layer L1. The feeder wire 411 is connected to the feeder wire 16. Further, the feeder wire 411 is supplied with the electric potential Vel. In addition, the feeder wire 411 is disposed to surround the display region 10 in plan view.

The feeder wire 411 has a plurality of protrusion portions 411a, and the protrusion portion 411a is electrically connected to the N-type impurity diffused region D2 through an interlayer connection portion Ha1 which penetrates the first interlayer insulation layer L1. A plurality of the protrusion portions 411a and a plurality of the interlayer connection portions Ha1 are periodically disposed at each row or at each column, as shown in FIG. 5 or 8.

As shown in FIGS. 8 and 9, in the peripheral region 40, a feeder wire 412 as the second conductive wiring layer is provided on the front surface side of the second interlayer insulation layer L2. The feeder wire 412 is supplied with the electric potential Vel in a similar manner to the feeder wire 411, and is disposed to surround the display region 10 in plan view.

The feeder wire 412 has a plurality of protrusion portions 412a, and the protrusion portion 412a is electrically connected to the feeder wire 411 through the interlayer connection portion Ha2 which penetrates the second interlayer insulation layer L2. A plurality of the protrusion portions 412a and a plurality of the interlayer connection portions Ha2 are periodically disposed at each row or at each column.

As described above, the feeder wire 411, the feeder wire 412, and the plurality of interlayer connection portions Ha2 correspond to the feeder wire 41. That is, the feeder wire 41 includes the plurality of conductive wiring layers. Further, the interlayer connection portion Ha1 corresponds to the contact portion C2.

As described above, the N-type impurity diffused regions D2 are supplied with the electric potential Vel from the feeder wires 41 (specifically, the feeder wire 411 and the feeder wire 412) through the contact portions C2.

In addition, in the embodiment, as shown in FIGS. 8 and 9, as viewed from the front surface side, the feeder wire 411, the feeder wire 412, and the N-type impurity diffused region D2 are disposed not to overlap with one another, but may be disposed to overlap with one another. In this case, the feeder wire 411 may not have the protrusion portion 411a, and the feeder wire 412 does not have to have the protrusion portion 412a. In this case, the feeder wire 412 is electrically connected to the feeder wire 411 through the interlayer connection portion Ha2, and the feeder wire 411 is electrically connected to the N-type impurity diffused region D2 through the interlayer connection portion Ha1.

As described above, in the embodiment, the feeder wires 16 with M rows are provided in the display region 10, and the plurality of contact portions C1 is provided to have one-to-one correspondence with the plurality of pixel circuits 110 in the display region 10. Further, the N-type impurity diffused regions D1 are supplied with the electric potential Vel from the feeder wires 16 through the plurality of contact portions C1.

The N-type impurity diffused region D1 has an electric resistance higher than that of the feeder wire 16 which is formed of a conductive material. Accordingly, the electric potential of the N-type impurity diffused region D1 becomes the electric potential Vel or an electric potential substantially the same as the electric potential Vel, near the feeding location at which the electric potential Vel is supplied, but becomes different from the electric potential Vel at a location apart from the feeding location. Specifically, a potential difference between the electric potential Vel and the electric potential of the N-type impurity diffused region D1 increases, as the distance from the feeding location at which the electric potential Vel is supplied increases.

Hence, if the contact portions C1 are not provided in the display region 10 and the electric potential Vel is supplied to the N well 152 through only the contact portions C2, the electric potentials of the N-type impurity diffused regions D1 becomes an electric potential which is significantly different from the electric potential Vel in the center portion of the display region 10. Further, if the plurality of contact portions C1 is not provided in the display region 10 and for example a single contact portion C1 is provided, the electric potentials of the N-type impurity diffused regions D1 becomes an electric potential which is significantly different from the electric potential Vel at a location distanced from the location of connection to the single contact portion C1. That is, in such a case, the electric potential of the N well 152 becomes non-uniform due to the position within the display region 10.

In contrast, in the embodiment, the plurality of contact portions C1 is provided to have one-to-one correspondence with the plurality of pixel circuits 110 in the display region 10. Hence, it is possible to set the electric potential of the N well 152 to the electric potential Vel or an electric potential which is approximate to the electric potential Vel throughout the entire display region 10. In addition, it is possible to make the substrate potential uniform throughout the entire display region 10.

However, the transistor 121 supplies current, of which the magnitude depends on the potential difference between the gate and source, to the OLED 130. Accordingly, when the electric potential of the N well 152 becomes different from the electric potential Vel near the source of the transistor 121 (that is, the P-type impurity diffused region P1), the electric potential of the source of the transistor 121 may become different from the electric potential Vel as the electric potential which should be properly set. In this case, the transistor 121 supplies current, of which the magnitude is different from that of the current corresponding to the gray level defined by the image data VIDEO, to the OLED 130. Hence, the OLED 130 emits light with a luminance different from the luminance corresponding to the gray level defined by the image data VIDEO.

Further, when the electric potential of the N well 152 is different in accordance with the position in the display region 10 and is non-uniform, in accordance with the position of the pixel circuit 110 disposed in the display region 10, the OLED 130 provided in the pixel circuit 110 emits light with the luminance different from the luminance corresponding to the gray level. Hence, this effect is visible as display unevenness.

Whereas, in the embodiment, the contact portion C1 is provided to include a part of the source electrode of the transistor 121. Hence, the location of connection between the contact portion C1 and the N-type impurity diffused region D1 is positioned near the P-type impurity diffused region P1, as shown in FIGS. 6 and 7. Accordingly, the electric potential of the N well 152 near the source of the transistor 121 is set to the electric potential Vel or an electric potential which is supposed to be the same as the electric potential Vel. Thus, the electric potential of the P-type impurity diffused region P1 is set to the electric potential Vel or the electric potential which is supposed to be the same as the electric potential Vel. Hence, the OLED 130 provided in each transistor 121 emits light at the accurate luminance corresponding to the gray level defined by the image data VIDEO.

Further, in the embodiment, the N-type impurity diffused regions D2 are disposed to surround the display region 10, and the N-type impurity diffused regions D2 are supplied with the electric potential Vel from the feeder wires 41 through the plurality of contact portions C2. Hence, at the end of at least the display region 10, it is possible to set the electric potential of the N well 152 to the electric potential Vel or the electric potential which is approximate to the electric potential Vel.

Accordingly, in the embodiment, compared with the case where the feeder wires 41, the contact portions C2, and the N-type impurity diffused regions D2 are not provided around the display region 10, it is possible to make the electric potential of the N well 152 uniform at the electric potential which is approximate to the electric potential Vel.

Furthermore in the embodiment, the feeder wire 41 includes the plurality of conductive wiring layers (the feeder wire 411 and the feeder wire 412). Hence, compared with the case where the feeder wire 41 is formed of a single conductive wiring layer, it is possible to reduce the wiring resistance of the feeder wire 41.

In addition, in the embodiment, the feeder wire 41 includes two conductive wiring layers of the first conductive wiring layer and the second conductive wiring layer, but may include three or more conductive wiring layers.

Hereinafter, in the transistor provided in the pixel circuit 110, the transistor of which the source electrode is connected to the contact portion C1 may be referred to as a "first transistor". Further, among the pixel circuits 110, the pixel circuit 110 having the first transistor may be referred to as a "first pixel circuit".

In the embodiment, all the pixel circuits 110 correspond to the first pixel circuit, and the transistor 121 provided in each pixel circuit 110 corresponds to the first transistor.

Further, in the peripheral region 40, as viewed from the front surface side, the region, in which the feeder wires 41, the contact portions C2, and the N-type impurity diffused regions D2 are arranged, may be referred to as an "arrangement region".

In the embodiment, the feeder wires 41, the contact portions C2, and the N-type impurity diffused regions D2 are arranged throughout the entire peripheral region 40 along the four sides of the display region 10 so as to surround the entire display region 10. That is, in the embodiment, the entire peripheral region 40 is set as the arrangement region.

In addition, it can be assumed that the display region 10 has one-to-one correspondence with the plurality of contact portions C1 provided in the display region 10 and is a region including the plurality of unitary display regions of which areas are equal to one another.

More specifically, in the embodiment, the region in which the single pixel circuit 110 is provided may be defined as a unitary display region. In this case, the contact portions C1 are provided to have one-to-one correspondence with the unitary display regions.

B. Second Embodiment

In the above-mentioned first embodiment, the contact portions C1 are provided to have one-to-one correspondence with the pixel circuits 110. Whereas, the second embodiment is different from the first embodiment in that the single contact portion C1 is provided in common to the plurality of pixel circuits 110.

Hereinafter, referring to FIGS. 10 to 12, a light emitting device according to the second embodiment will be described. In addition, in the exemplary embodiments to be described later, each detailed description of components, of which operations and functions are equivalent to those of the components of the first embodiment, will be appropriately omitted by using the reference numerals and signs in the above description (it is the same for the embodiments and Modification Examples to be described later).

Figure 10:
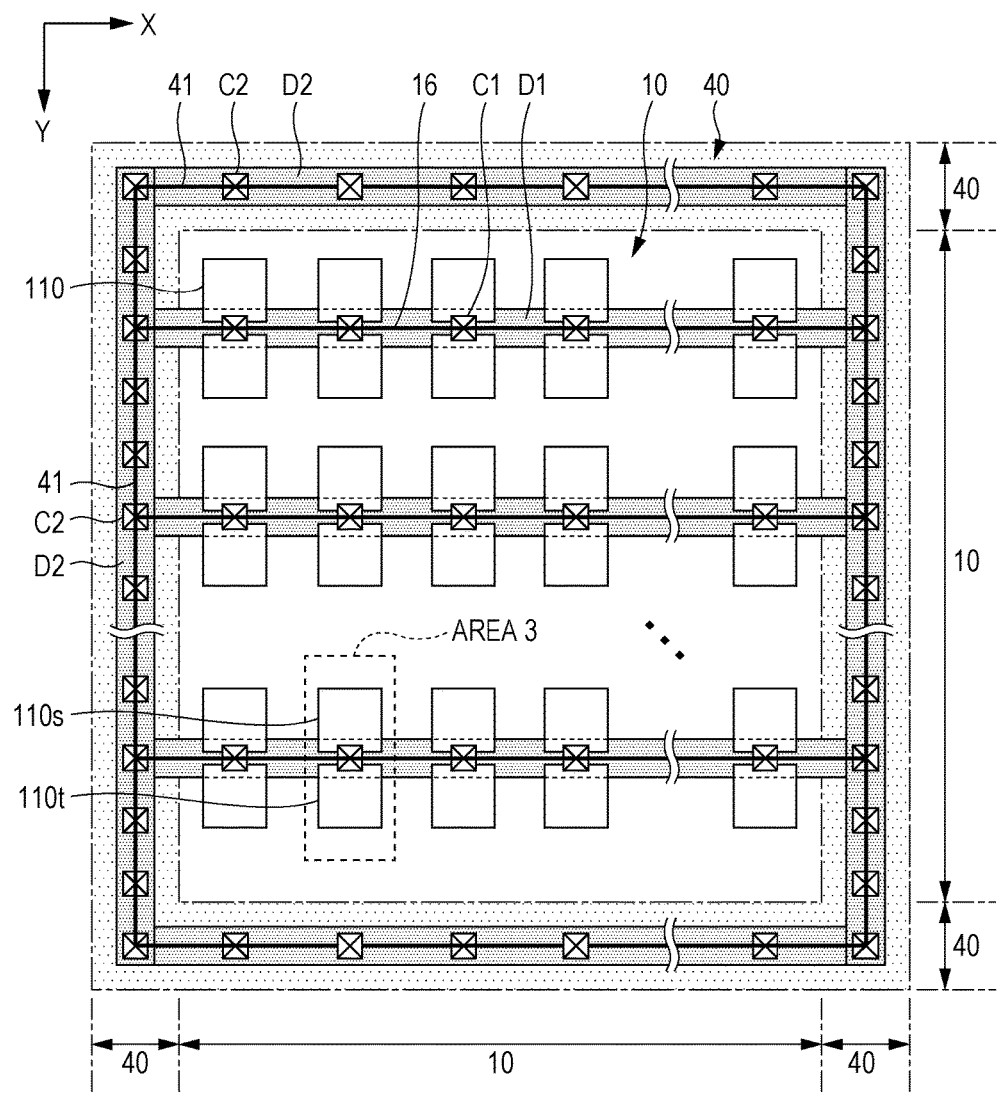
FIG. 10 is an explanatory diagram illustrating a display region and a peripheral region in a light emitting device according to a second embodiment.

FIG. 10 is a top plan view of the display region 10 and the peripheral region 40 of a display panel of the light emitting device according to the second embodiment.

As shown in FIG. 10, in the light emitting device according to the second embodiment, the N-type impurity diffused regions D1 and the feeder wires 16 are provided in the display region 10 with a proportion of one row thereof to two rows of the pixel circuits 110. Further, in the light emitting device according to the second embodiment, the N contact portions C1 are disposed in the feeder wire 16 of a single row in the display region 10 such that each contact portion is at each column. That is, in the light emitting device according to the second embodiment, one contact portion C1 is provided for the two pixel circuits 110 which are adjacent to each other in the vertical direction (Y direction) of the drawing.

In addition, in the peripheral region 40, in a similar manner to the light emitting device 1 according to the first embodiment, the feeder wires 41, the N-type impurity diffused regions D2, and the plurality of contact portions C2 are arranged along the four sides of the display region 10 so as to surround the display region 10.

Figure 11:
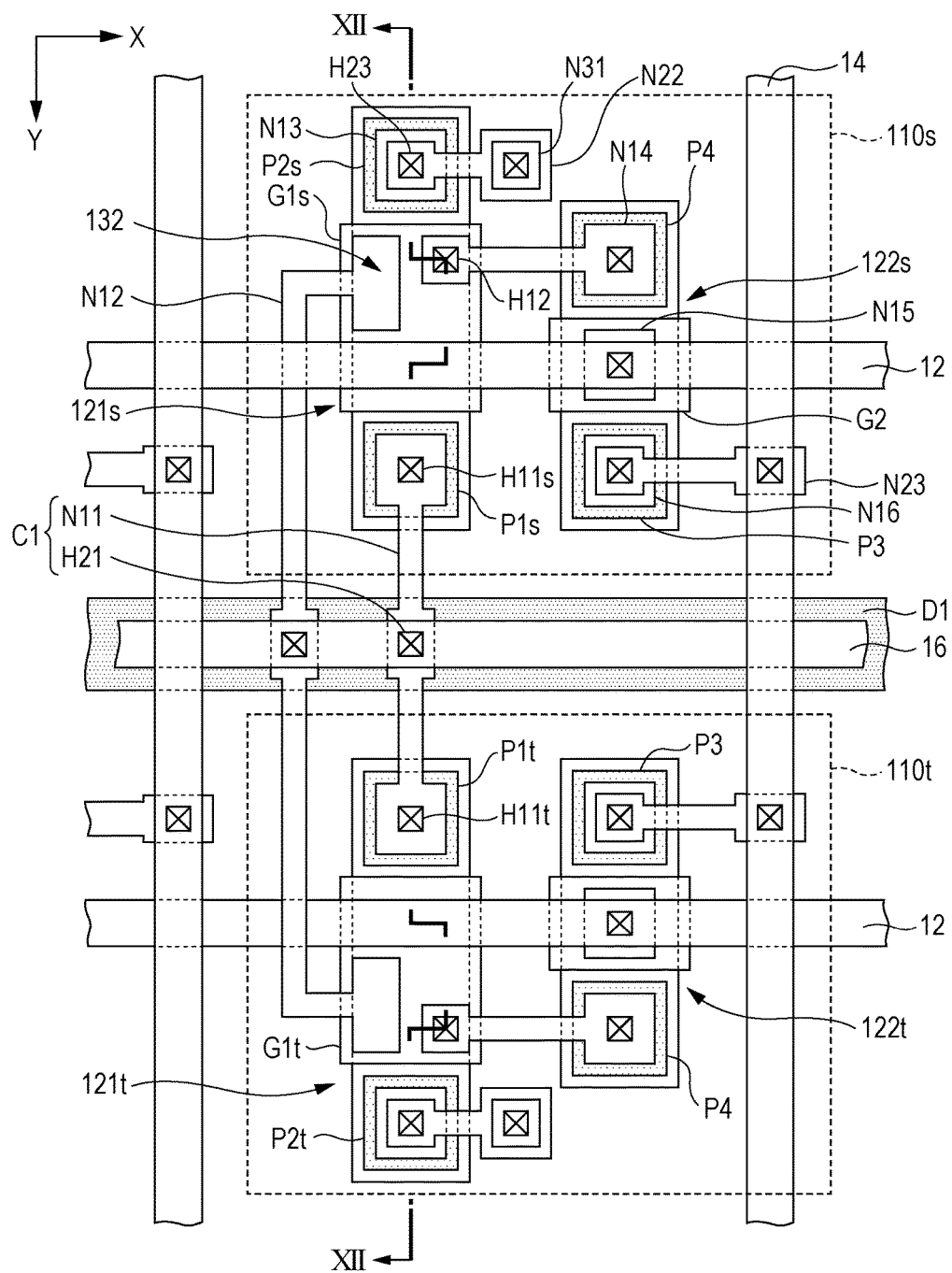
FIG. 11 is a top plan view illustrating a configuration of pixel circuits in the light emitting device.
Figure 12:
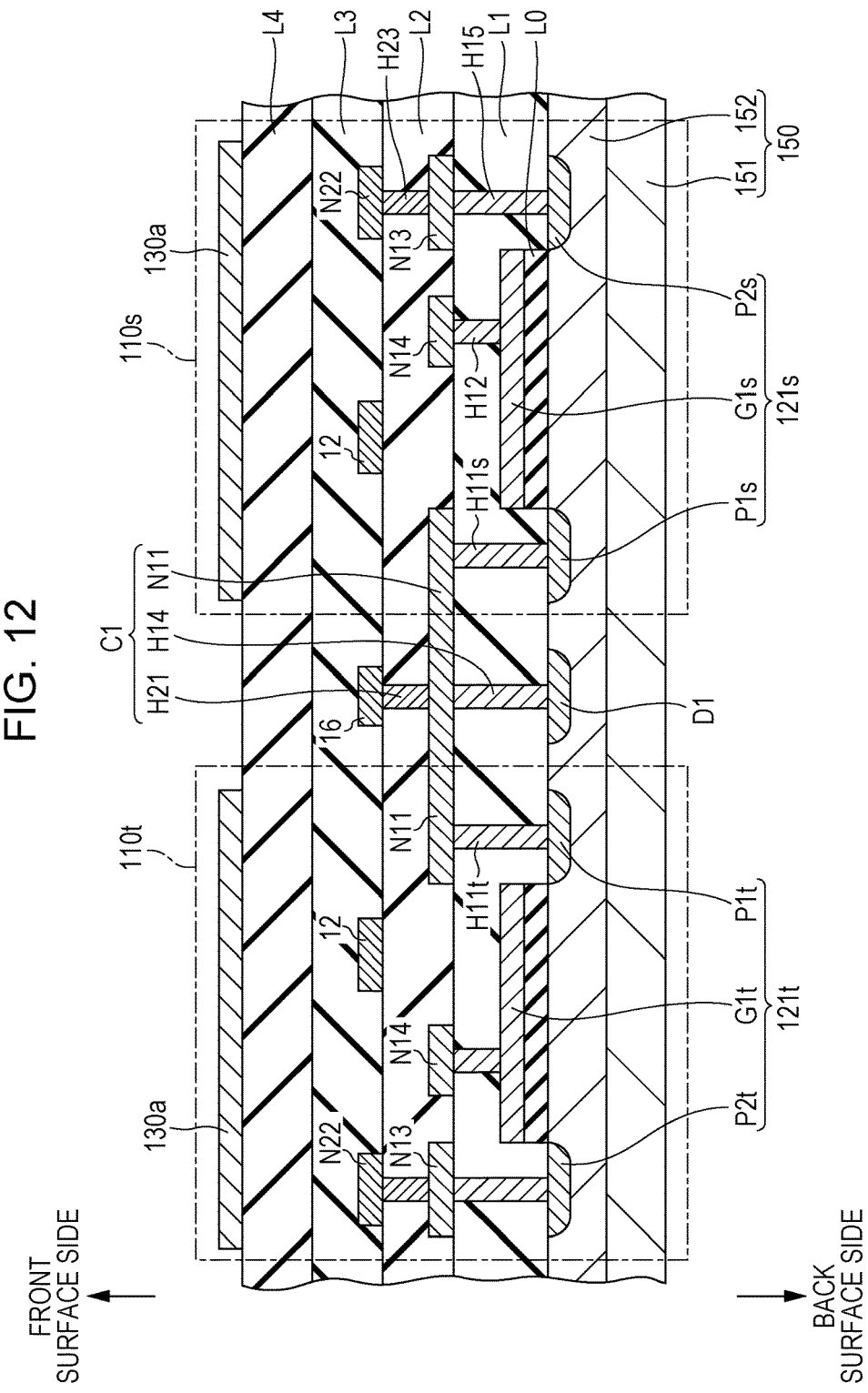
FIG. 12 is a partial cross-sectional view illustrating the configuration of the pixel circuits in the light emitting device.

Referring to FIGS. 11 and 12, a structure of the pixel circuit 110 according to the second embodiment will be described.

FIG. 11 is a top plan view illustrating a configuration of the two pixel circuits 110 which are adjacent to each other in the Y direction with the feeder wire 16 interposed therebetween, as shown in, for example, the portion Area3 of FIG. 10. As shown in FIG. 11, the two pixel circuits 110, which are adjacent to each other in the Y direction with the feeder wire 16 interposed therebetween, are disposed to be line-symmetric with respect to the feeder wire 16 as a center line.

FIG. 12 is a partial cross-sectional view taken along the line E-e of FIG. 11. In FIGS. 11 and 12, the layers, the members, the regions, and the like may have scales different from actual scales in order to have recognizable sizes.

In the embodiment, for convenience of description, between the two pixel circuits 110 which are adjacent to each other in the Y direction with the feeder wire 16 interposed therebetween, in FIG. 11, the pixel circuit 110 above the feeder wire 16 may be referred to as a pixel circuit 110s (an example of the "second pixel circuit"), and the pixel circuit 110 below the feeder wire 16 may be referred to as a pixel circuit 110t (an example of the "third pixel circuit"). That is, in the second embodiment, the plurality of pixel circuits 110 arranged in the display region 10 includes a plurality of sets each of which includes the two pixel circuits 110 of the pixel circuit 110s and the pixel circuit 110t. The two pixel circuits 110 are adjacent to each other in the Y direction with the feeder wire 16 interposed therebetween.

Further, for convenience of description, among the components of the pixel circuits 110, the components of the pixel circuit 110s may be represented by signs to which the subscript "s" is attached, and the components of the pixel circuit 110t may be represented by signs to which the subscript "t" is attached. For example, when the interlayer connection portion H11 is provided in the pixel circuit 110s, the interlayer connection portion H11 may be referred to as an "interlayer connection portion H11s".

As shown in FIGS. 11 and 12, the transistor 121s provided in the pixel circuit 110s includes: a P-type impurity diffused region P1s which functions as a source of the transistor 121s; a P-type impurity diffused region P2s which functions as a drain thereof; and a gate node G1s which functions as a gate thereof.

Further, the transistor 121t provided in the pixel circuit 110t includes: a P-type impurity diffused region P1t which functions as a source of the transistor 121t; a P-type impurity diffused region P2t which functions as a drain thereof; and a gate node G1t which functions as a gate thereof.

The feeder wire 16 is electrically connected to the P-type impurity diffused region P1s through the interlayer connection portion H21, the relay node N11, and the interlayer connection portion H11s, and is electrically connected to the P-type impurity diffused region P1t through the interlayer connection portion H21, the relay node N11, and the interlayer connection portion H11t. Further, the feeder wire 16 is electrically connected to the N-type impurity diffused region D1 through the interlayer connection portion H21, the relay node N11, and the interlayer connection portion H14.

Hence, the P-type impurity diffused region P1s, the P-type impurity diffused region P1t, and the N-type impurity diffused region D1 are supplied with the electric potential Vel from the feeder wire 16.

The interlayer connection portion H21, the relay node N11, and the interlayer connection portion H11s correspond to the source electrode of the transistor 121s. The interlayer connection portion H21, the relay node N11, and the interlayer connection portion H11t correspond to the source electrode of the transistor 121t. Further, the interlayer connection portion H21, the relay node N11, and the interlayer connection portion H14 correspond to the contact portion C1.

That is, in the second embodiment, the contact portion C1 is connected to the source electrode of the transistor 121s and the source electrode of the transistor 121t. More specifically, in the second embodiment, the contact portion C1 includes a part of the source electrode of the transistor 121s and a part of the source electrode of the transistor 121t.

As described above, in the second embodiment, in the display region 10, the N-type impurity diffused regions D1, the feeder wires 16, and the plurality of contact portions C1 are provided with a proportion of one row thereof to two rows of the pixel circuits 110. Thus, compared with the first embodiment, the number of the N-type impurity diffused regions D1, the number of the feeder wires 16, and the number of the contact portions C1 can be reduced by half.

Hence, it is possible to decrease the pitch of the pixel circuit 110, and it is possible to decrease the size of the light emitting device.

Further, in the second embodiment, the plurality of contact portions C1 is provided in the display region 10. Hence, it is possible to set the electric potential of the N well 152 to the electric potential Vel or an electric potential which is approximate to the electric potential Vel throughout the entire display region 10. In addition, it is possible to make the substrate potential uniform throughout the entire display region 10.

In addition, also in the second embodiment, all the pixel circuits 110 correspond to the first pixel circuit. That is, the second pixel circuit and the third pixel circuit correspond to the first pixel circuit. Further, the transistor 121 provided in each pixel circuit 110 corresponds to the first transistor.

Further, the unitary display region in the second embodiment is, as viewed from the front surface side, a region (for example, a portion Area3 in FIG. 10) where there are provided two pixel circuits 110 which are adjacent to each other in the Y direction with the feeder wire 16 interposed therebetween.

In addition, FIGS. 10 to 12 show the exemplary case where one contact portion C1 is provided in common to the two pixel circuits 110. However, the invention is not limited to the embodiment, and one contact portion C1 may be provided in common to three or more pixel circuits 110.

Figure 13:
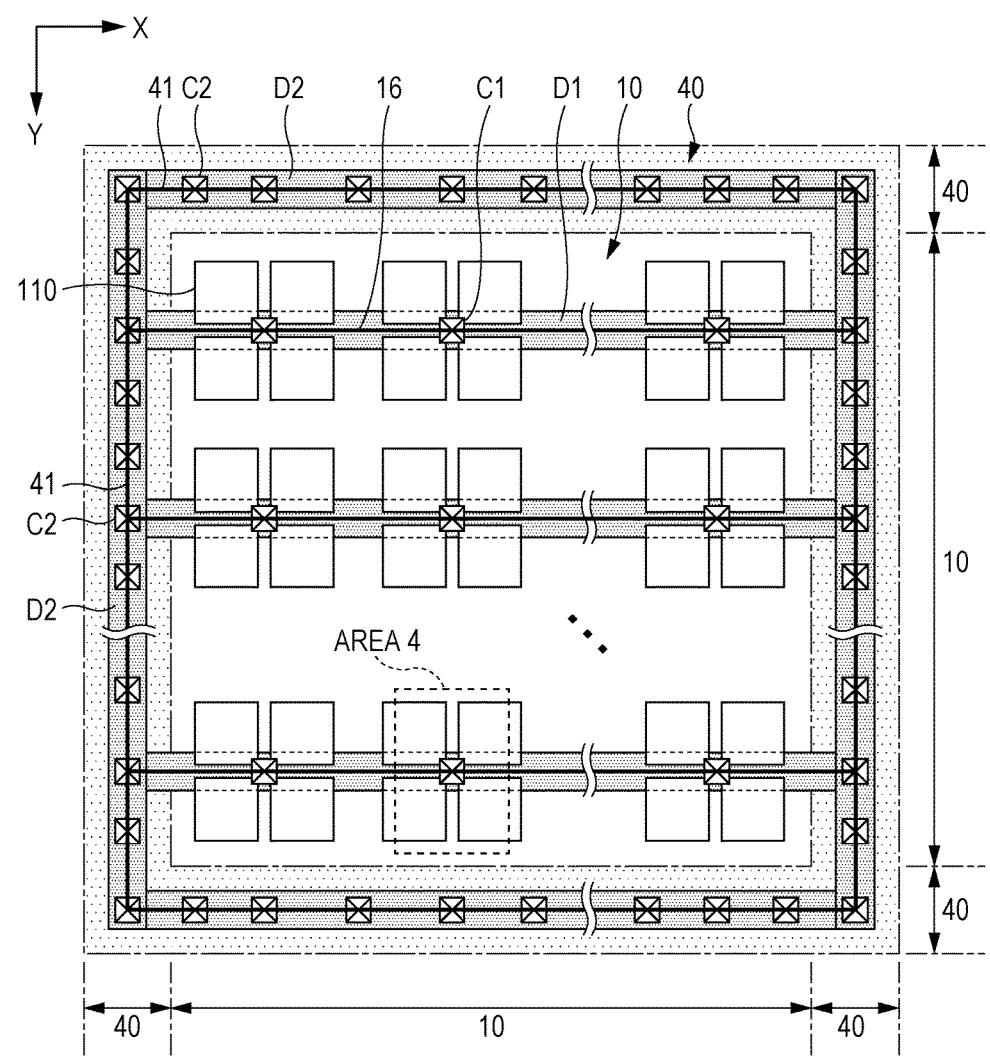
FIG. 13 is an explanatory diagram illustrating the display region and the peripheral region in the light emitting device according to the second embodiment.

For example, as shown in FIG. 13, one contact portion C1 may be provided in common to four pixel circuits 110. In this case, one contact portion C1 is connected to the source electrodes of the four transistors 121 provided in the four pixel circuits 110.

In addition, in this example, one unitary display region corresponds to a region (for example, a portion Area4 in FIG. 13) where there provided four pixel circuits 110 which are connected to one contact portion C1, as viewed from the front surface side.

Further, for example, one contact portion C1 may be provided for three pixel circuits 110 corresponding to three display colors (RGB) which can be displayed by the light emitting device. In this case, one contact portion C1 is connected to the source electrodes of the three transistors 121 provided in the three pixel circuits 110.

It should be noted that, hereinafter, a set of the three pixel circuits 110 corresponding to the three display colors (RGB), which can be displayed by the light emitting device, may be referred to as a "display block".

C. Third Embodiment

In the above-mentioned first and second embodiments, the contact portion C1 includes a part of the source electrode of the transistor 121. Whereas, the third embodiment is different from the first and second embodiments in that the contact portion C1 is formed without including the source electrode of the transistor 121.

Figure 14:
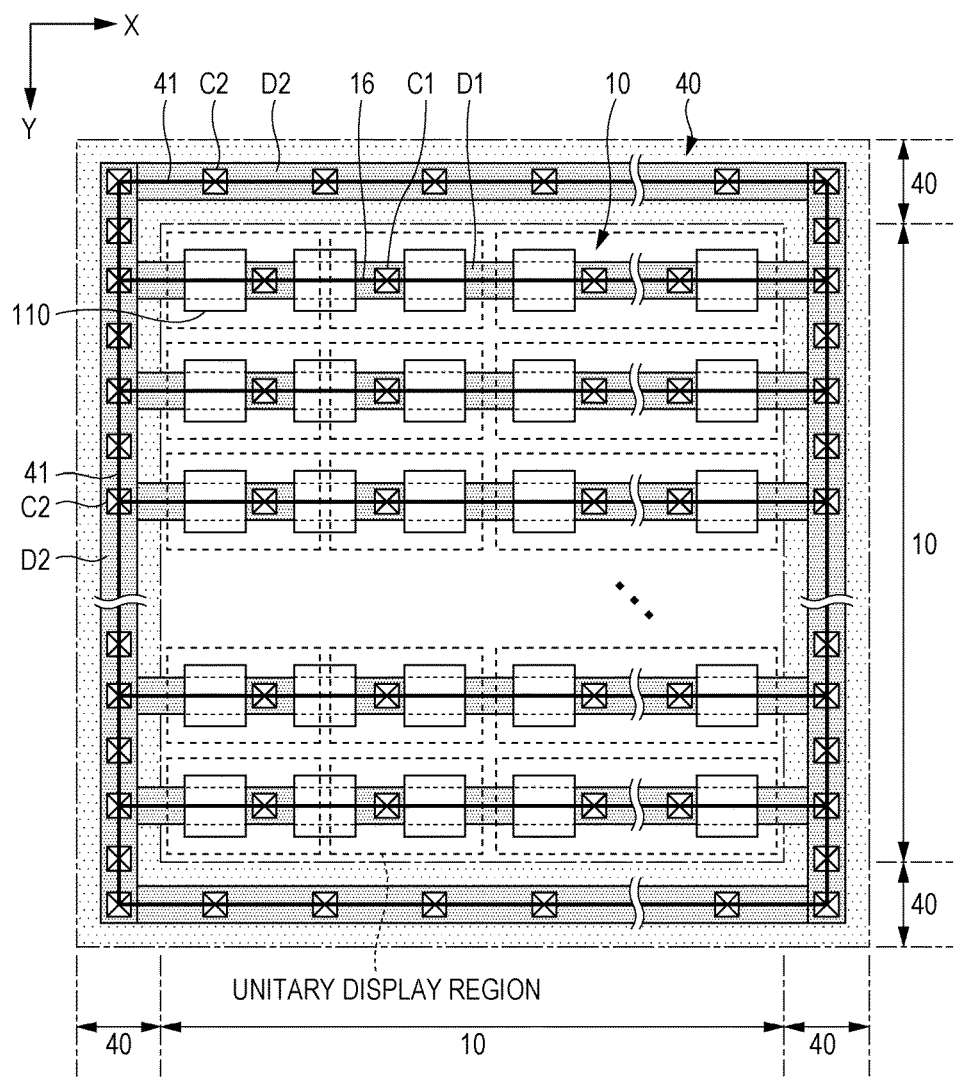
FIG. 14 is an explanatory diagram illustrating a display region and a peripheral region in a light emitting device according to a third embodiment.

FIG. 14 is a top plan view of the display region 10 and the peripheral region 40 of a display panel of the light emitting device according to the third embodiment. As shown in FIG. 14, in the light emitting device according to the third embodiment, two contact portions C1 are provided for three pixel circuits 110 in the display region 10. That is, the contact portions C1 are disposed with a proportion of one contact portion C1 to one-and-a-half pixel circuits 110. That is, in the third embodiment, the unitary display region corresponds to one and a half of the region in which the pixel circuit 110 is provided.

Figure 15:
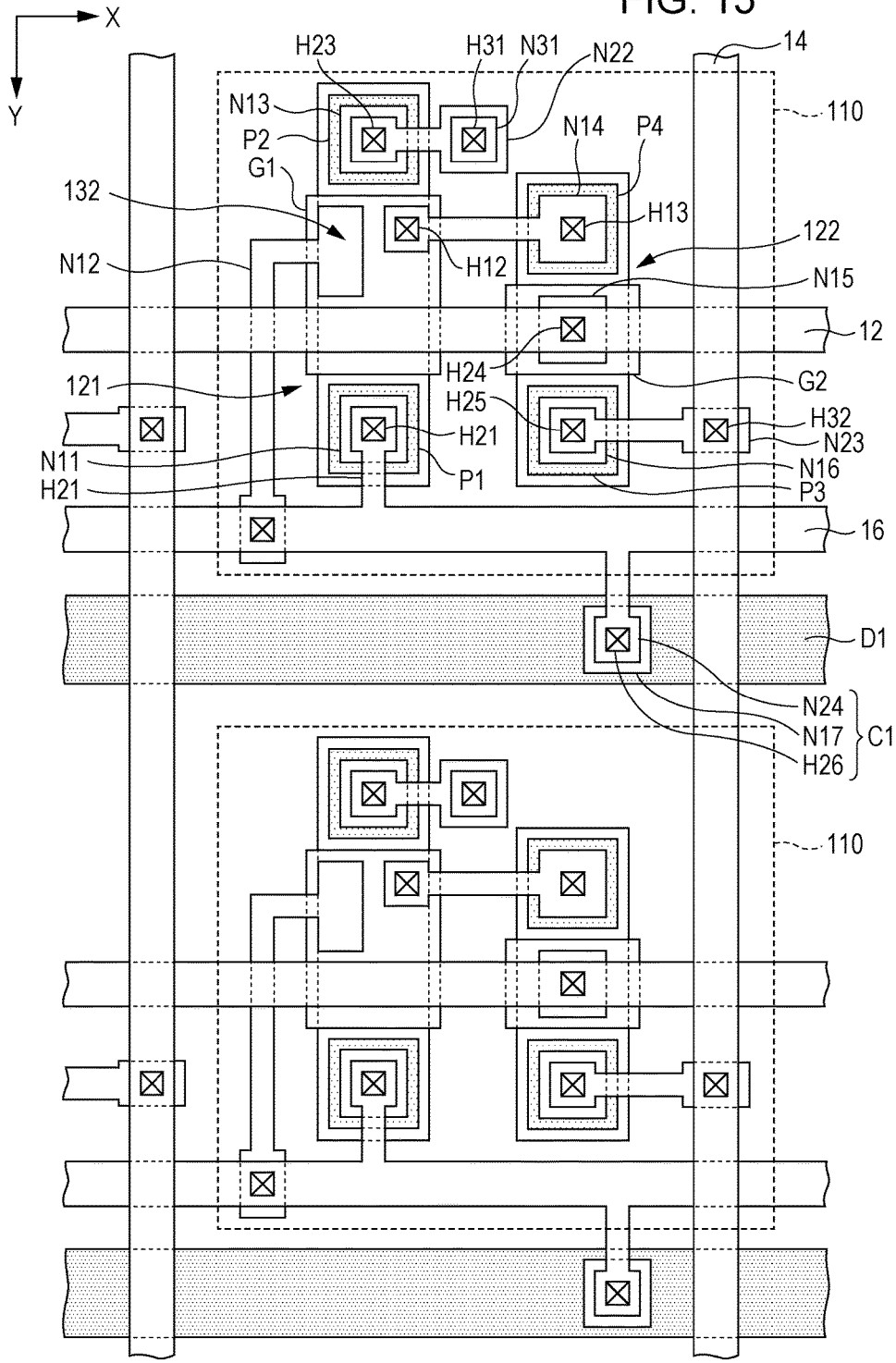
FIG. 15 is a top plan view illustrating a configuration of pixel circuits in the light emitting device.

Referring to FIG. 15, a structure of the pixel circuit 110 according to the third embodiment will be described. FIG.

15 is a top plan view illustrating a configuration of the two pixel circuits 110 which are adjacent to each other in the Y direction.

As shown in FIG. 15, the feeder wire 16 is electrically connected to the P-type impurity diffused region P1 through the relay node N21, the interlayer connection portion H21, the relay node N11, and the interlayer connection portion H11 (refer to FIG. 7). That is, the relay node N21, the interlayer connection portion H21, the relay node N11, and the interlayer connection portion H11 correspond to the source electrode of the transistor 121s.

Further, the feeder wire 16 is electrically connected to the N-type impurity diffused region D1 through the interlayer connection portion (not shown in FIG. 15) which penetrates the relay node N24, the interlayer connection portion H26, the relay node N17, and the first interlayer insulation layer L1 so as to connect the relay node N17 and the N-type impurity diffused region D1. That is, the relay node N24, the interlayer connection portion H26, the relay node N17, and the interlayer connection portion which connects the relay node N17 and the N-type impurity diffused region D1 correspond to the contact portion C1.

As described above, in the third embodiment, the contact portion C1 is formed without including the source electrode of the transistor 121. That is, in the light emitting device according to the third embodiment, the first pixel circuit is not provided, and the first transistor is also not provided.

In the above-mentioned third embodiment, the plurality of contact portions C1 is also provided in the display region 10. Hence, it is possible to set the electric potential of the N well 152 to the electric potential Vel or an electric potential which is approximate to the electric potential Vel throughout the entire display region 10. In addition, it is possible to make the substrate potential uniform throughout the entire display region 10.

In addition, FIG. 14 shows the exemplary case where one contact portion C1 is provided for one-and-a-half pixel circuits 110. However, the invention is not limited to the embodiment. For example, one contact portion C1 may be provided for a display block formed of three pixel circuits 110 corresponding to three display colors (RGB) which can be displayed by the light emitting device. In short, one contact portion C1 may be provided for pixel circuits 110 of which the number is greater than one.

D. Fourth Embodiment

In the above-mentioned first to third embodiments, all the plurality of pixel circuits 110 provided in the display region 10 are formed as either one of the first pixel circuits or pixel circuits other than the first pixel circuits. Whereas, the fourth embodiment is different from the first to third embodiments in that the first pixel circuits as the plurality of pixel circuits 110 provided in the display region 10 are mixed with pixel circuits other than the first pixel circuits.

Figure 16:
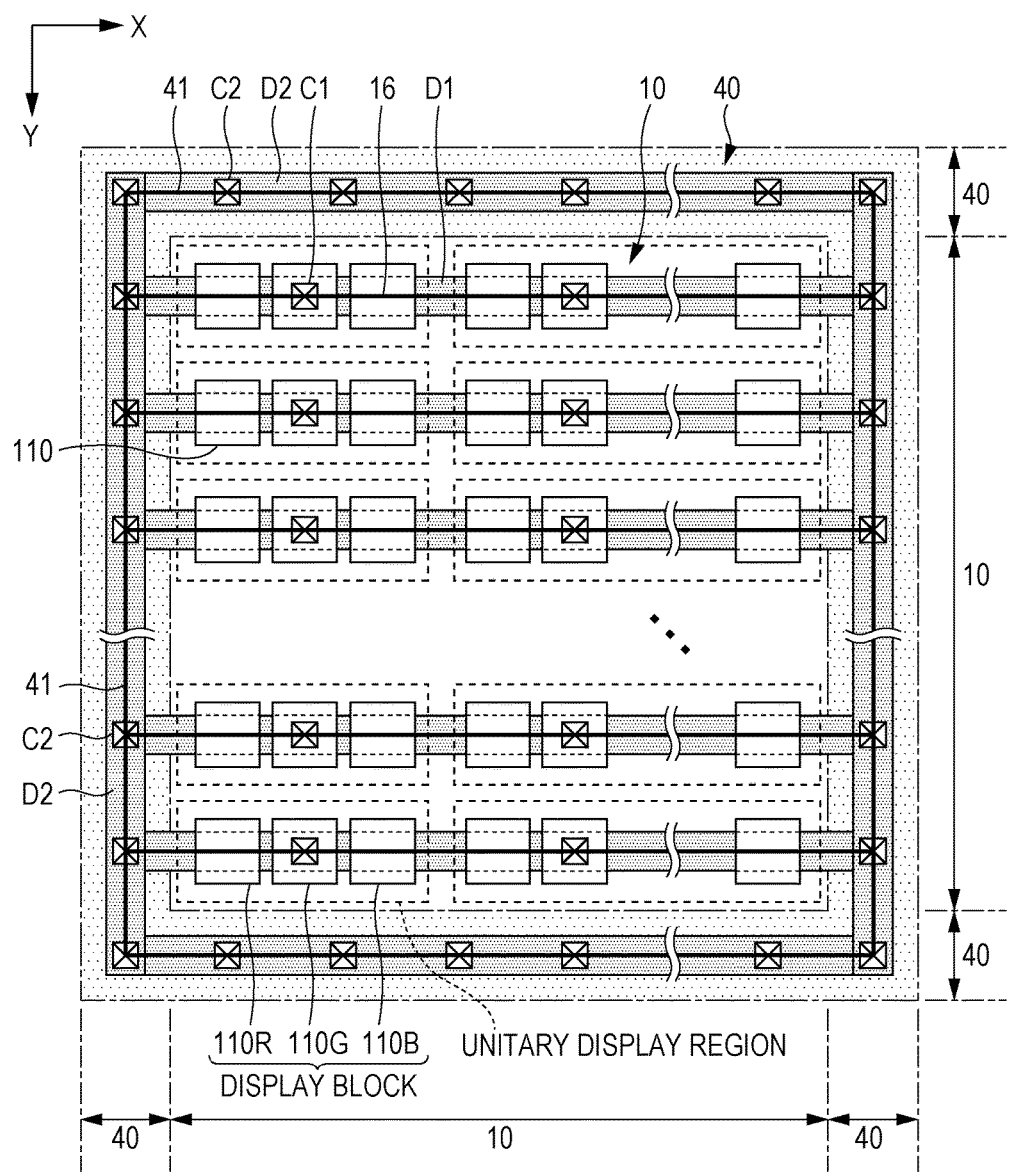
FIG. 16 is an explanatory diagram illustrating a display region and a peripheral region in a light emitting device according to a fourth embodiment.

FIG. 16 is a top plan view of the display region 10 and the peripheral region 40 of a display panel of the light emitting device according to the fourth embodiment. As shown in FIG. 16, in the light emitting device according to the fourth embodiment, one contact portion C1 is provided for the three pixel circuits 110 (110R, 110G, 110B) constituting the display block in the display region 10.

More specifically, among the three pixel circuits 110 constituting the display block, one pixel circuit 110 (a pixel circuit 110G in the example shown in FIG. 16) is the first pixel circuit, and the other two pixel circuits 110 (in this example, the pixel circuit 110R and the pixel circuit 110B) are the pixel circuits other than the first pixel circuit. The source electrode of the transistor 121, which is provided in one first pixel circuit included in the display block, is connected to the contact portion C1.

As described above, in the fourth embodiment, the display block includes one first pixel circuit. In other words, one unitary display region includes one display block.

In the fourth embodiment, the plurality of contact portions C1 is also provided in the display region 10. Hence, it is possible to set the electric potential of the N well 152 to the electric potential Vel or an electric potential which is approximate to the electric potential Vel throughout the entire display region 10. In addition, it is possible to make the substrate potential uniform throughout the entire display region 10.

E. Fifth Embodiment

Figure 17:
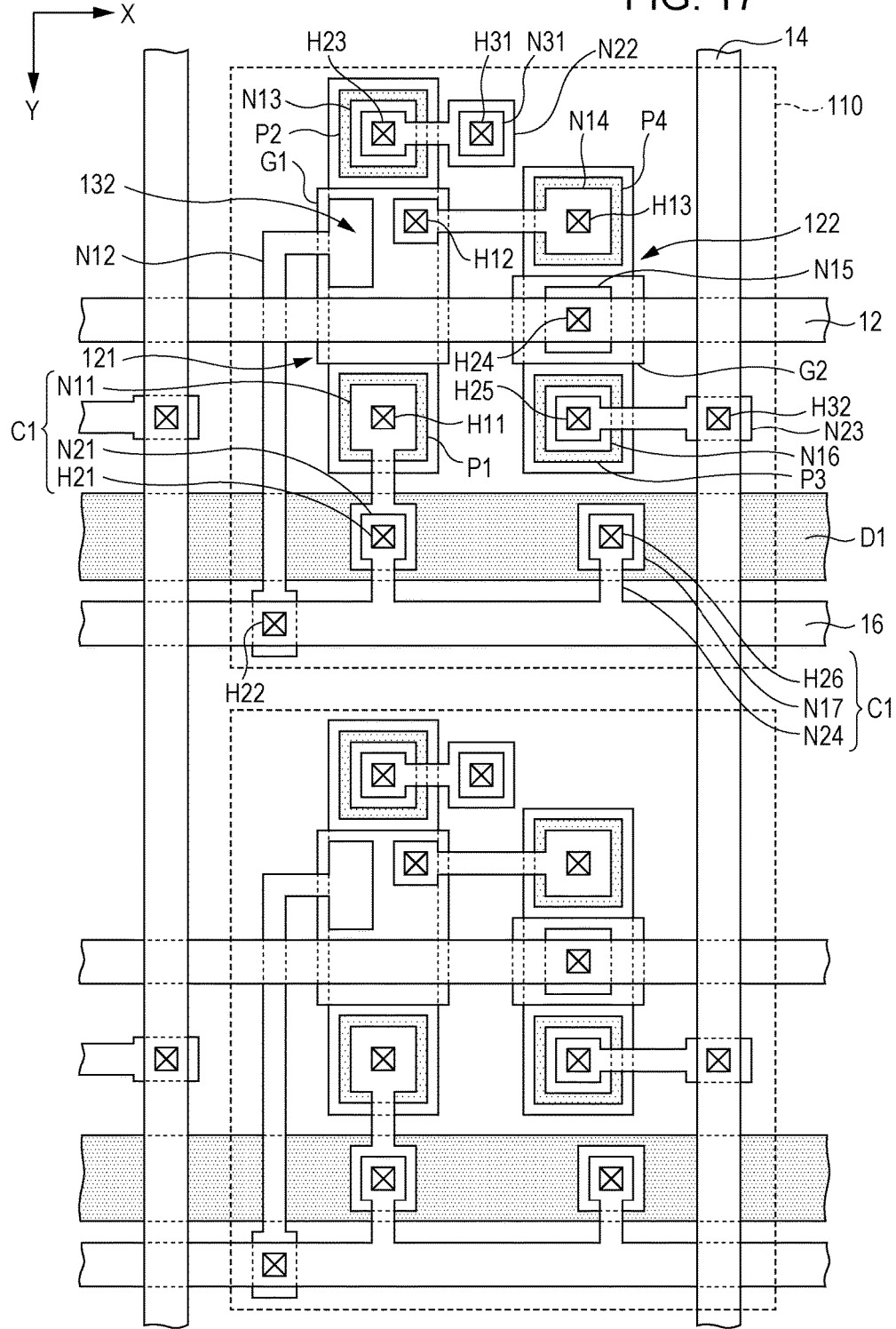
FIG. 17 is a top plan view illustrating a configuration of pixel circuits in a light emitting device according to a fifth embodiment.

In the above-mentioned first to fourth embodiments, one contact portion C1 is provided for one or more pixel circuits 110. Whereas, the fifth embodiment is different from the first to fourth embodiments in that the contact portions C1 of which the number is greater than one are provided for one pixel circuit 110. Referring to FIG. 17, a structure of the pixel circuit 110 according to the fifth embodiment will be described.

FIG. 17 is a top plan view illustrating a configuration of two pixel circuits 110 which are adjacent to each other in the Y direction. As shown in the drawing, in the light emitting device according to the fifth embodiment, the two contact portions C1 are provided for one pixel circuit 110.

As shown in FIG. 17, the relay node N21, the interlayer connection portion H21, the relay node N11, and the interlayer connection portion H11 (refer to FIG. 7), which electrically connect the feeder wire 16 and the P-type impurity diffused region P1, correspond to the source electrode of the transistor 121s. Further, the relay node N21, the interlayer connection portion H21, the relay node N11, and the interlayer connection portion H14 (refer to FIG. 7), which electrically connect the feeder wire 16 and the N-type impurity diffused region D1, correspond to the contact portion C1. Furthermore, the relay node N24, the interlayer connection portion H26, and the relay node N17, which electrically connect the feeder wire 16 and the N-type impurity diffused region D1, and the interlayer connection portion, which connects the relay node N17 and the N-type impurity diffused region D1, also correspond to the contact portion C1.

As described above, in the fifth embodiment, the two contact portions C1 are provided for one pixel circuit 110. Hence, it is possible to set the electric potential of the N well 152 to the electric potential Vel or an electric potential which is approximate to the electric potential Vel throughout the entire display region 10. In addition, it is possible to make the substrate potential uniform throughout the entire display region 10.

FIG. 17 shows the exemplary case where the two contact portions C1 are provided for one pixel circuit 110. However, the invention is not limited to the embodiment, and three or more contact portions C1 may be provided for one pixel circuit 110.

Further, the light emitting device according to the fifth embodiment is not limited to a configuration in which the contact portions C1 of which the number is an integral multiple of the number of the pixel circuits 110 is provided. For example, three contact portions C1 may be provided for two pixel circuits 110. In short, the contact portions C1, of which the number is greater than one, may be provided for one pixel circuit 110.

In addition, in FIG. 17, it is assumed that each of the plurality of pixel circuits 110 provided in the display region 10 is the first pixel circuit. That is, it is assumed that, among the contact portions C1 which are provided for the pixel circuit 110 and of which the number is greater than one, at least one contact portion C1 is formed to include a part of the source electrode of the transistor 121.

However, the invention is not limited to the embodiment, and all the pixel circuits may be pixel circuits other than the first pixel circuits, and the first pixel circuits may be mixed with the pixel circuits other than the first pixel circuits.

F. Modification Examples

The invention is not limited to the above-mentioned embodiments, and may be modified into, for example, various forms to be described below. Further, one of the modification examples to be described below may be arbitrarily selected, or a plurality of the examples may be appropriately combined.

Modification Example 1

In the above-mentioned embodiment, the entire peripheral region 40 is an arrangement region. However, the invention is not limited to the embodiment, and the arrangement region may be a part of the peripheral region 40. In this case, the arrangement region may be one region which is continuous, and may be two or more regions separated from each other.

Figure 18:
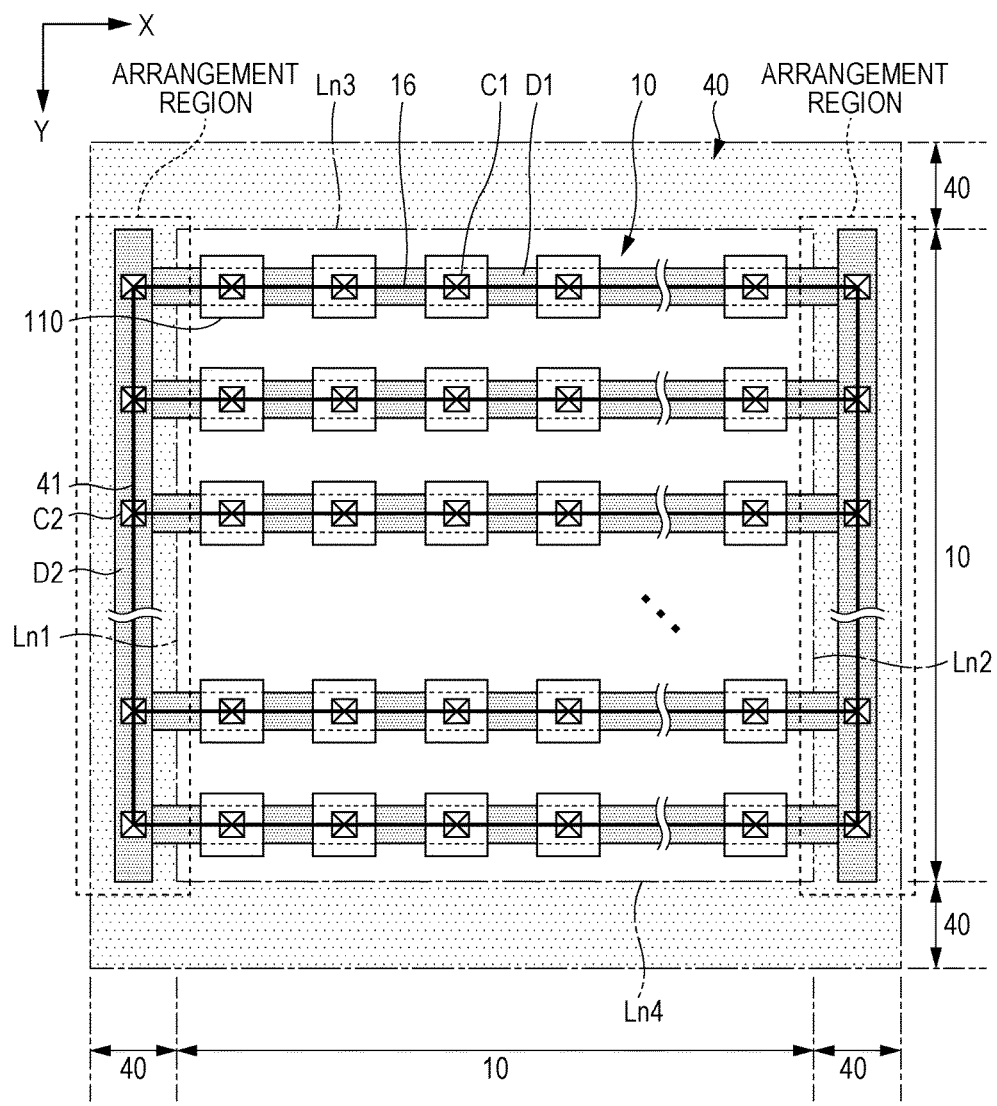
FIG. 18 is an explanatory diagram illustrating a display region and a peripheral region in a light emitting device according to Modification Example 1.

For example, as shown in FIG. 18, the arrangement region may be two regions formed of a region, which is along the left side Ln1, and a region, which is along the right side Ln2, in the drawing, among the four sides Ln1 to Ln4 forming a quadrangle which indicates a boundary between the display region 10 and the peripheral region 40. Further, the arrangement region may be a region along one side and may be a region along the single side and regions along the three sides, among the four sides Ln1 to Ln4. Furthermore, the arrangement region may be a region including a region along at least a part of one side (for example, an upper half part of the side Ln1) among the four sides Ln1 to Ln4. In short, the arrangement region may be a region including at least a part of the peripheral region 40.

Modification Example 2

Figure 19:
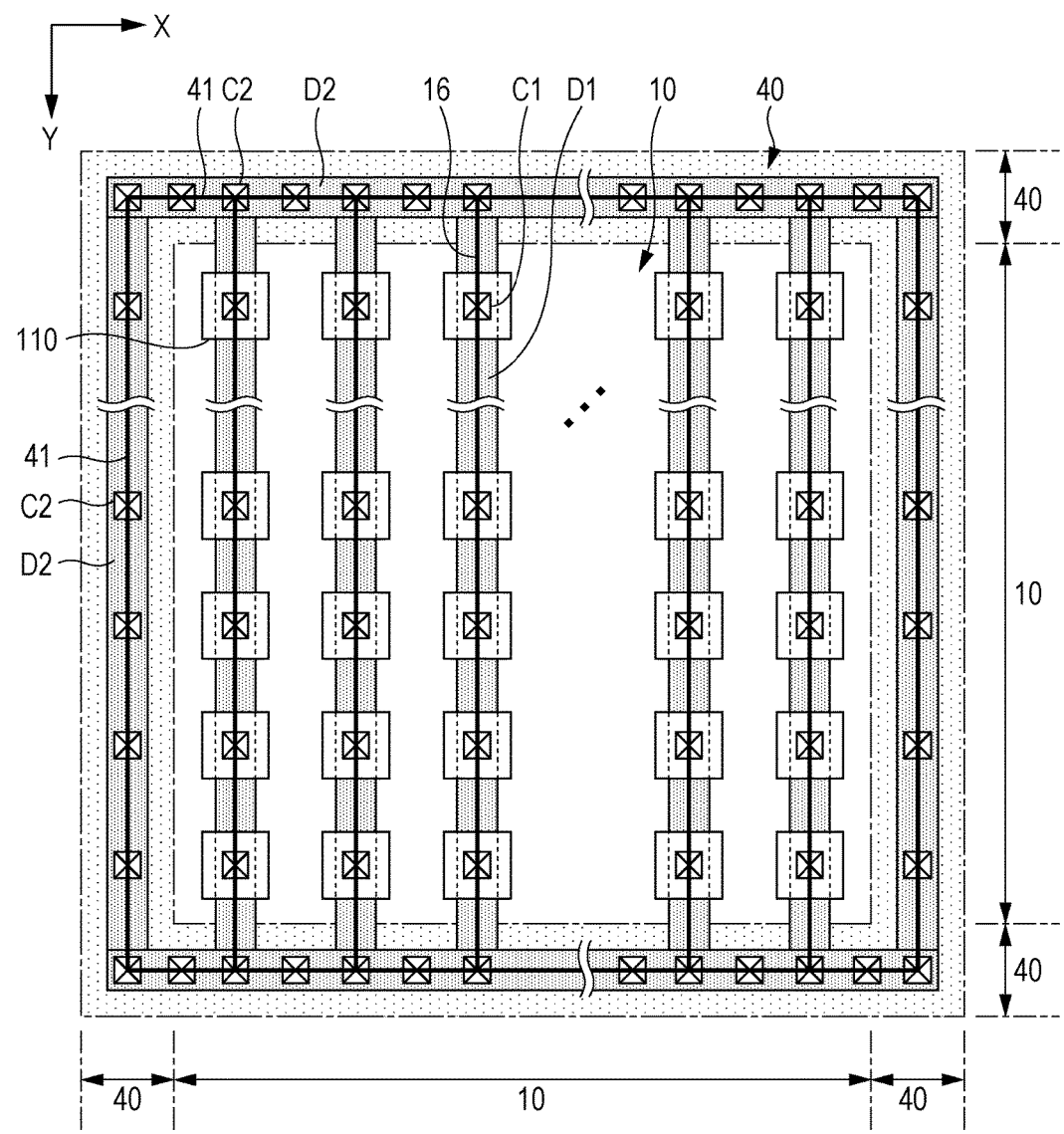
FIG. 19 is an explanatory diagram illustrating a display region and a peripheral region in a light emitting device according to Modification Example 2.

In the above-mentioned embodiments and modification example, the feeder wires 16 and N-type impurity diffused regions D1 are provided to extend in the horizontal direction (X direction). However, the invention is not limited to the embodiments and examples, and as shown in FIG. 19, the feeder wires 16 and N-type impurity diffused regions D1 may be provided to extend in the vertical direction (Y direction). In this case, for the feeder wire 16 and the N-type impurity diffused region D1 of a single column extending in the vertical direction, the plurality of contact portions C1, which connects those, is provided.

In addition, in the present modification example, the feeder wires 16 and the N-type impurity diffused regions D1 may be provided with a proportion of one column thereof to one column of the pixel circuits 110, and may be provided with a proportion of one column thereof to two columns of the pixel circuits 110.

Modification Example 3

In the above-mentioned embodiments and modification examples, the feeder wires 16 and the N-type impurity diffused regions D1 may be provided to extend in either one of the horizontal direction (X direction) or the vertical direction (Y direction). However, the invention is not limited to the embodiments and examples, and the feeder wires 16 and the N-type impurity diffused regions D1 may be arranged in the vertical direction (Y direction), and may be arranged in a lattice shape in the vertical direction (Y direction).

Modification Example 4

In the above-mentioned embodiments and modification examples, the transistors 121 and 122 provided in the pixel circuits 110 are P-channel type transistors. However, the invention is not limited to the embodiments, and for example, as shown in FIG. 20, the transistors may be N-channel type transistors.

Figure 20:
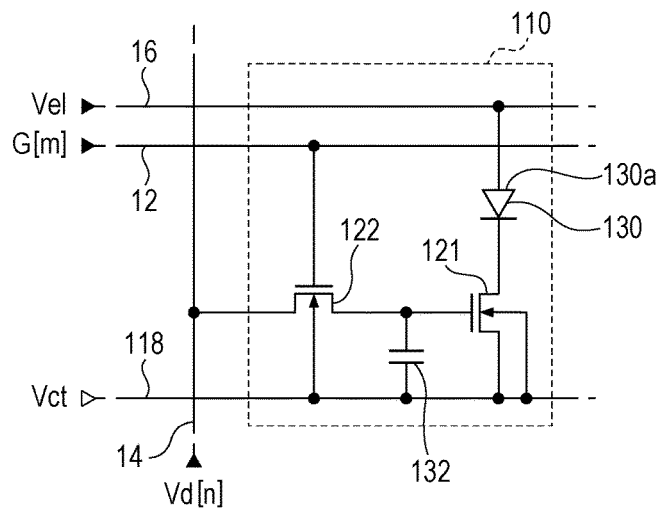
FIG. 20 is a diagram illustrating a pixel circuit in a light emitting device according to Modification Example 4.

As shown in FIG. 20, the pixel circuit 110 according to Modification Example 4 is provided with N-channel MOS-type transistors 121 and 122. The source of the transistor 121 is electrically connected to the feeder wire 118, and the drain thereof is electrically connected to the cathode of the OLED 130.

The feeder wire 118 is supplied with the electric potential Vct. Further, the semiconductor substrate, on which the pixel circuits are provided, is supplied from the electric potential Vct from the feeder wire 118 through the P-type impurity diffused region which is provided on the semiconductor substrate.

As described above, in the example shown in FIG. 20, the P-type impurity diffused region, which is supplied with the electric potential Vct, in the semiconductor substrate corresponds to the "first impurity diffused region", and the electric potential Vct corresponds to the "predetermined electric potential". Further, the feeder wire 118, which supplies the electric potential Vct to the semiconductor substrate, corresponds to the "first wiring", and the wiring, which connects the feeder wire 118 and the P-type impurity diffusion layer, corresponds to the "first contact portion".

In this case, it is preferable that the wiring (the source electrode of the transistor 121), which electrically connects the source of the transistor 121 and the feeder wire 118, be provided to be connected to the first contact portion.

In addition, in the example shown in FIG. 20, all the plurality of transistors provided in the pixel circuit 110 are formed as the N-channel type transistors. However, the pixel circuit 110 may include both the P-channel type transistor and the N-channel type transistor.

Modification Example 5

In the above-mentioned embodiments and modification examples, the pixel circuit 110 includes two transistors of the transistor 121 and the transistor 122. However, the invention is not limited to the embodiments, and the pixel circuit 110 may include three or more transistors. For example, as shown in FIGS. 21 and 22, the pixel circuit 110 may include five transistors.

Figure 21:
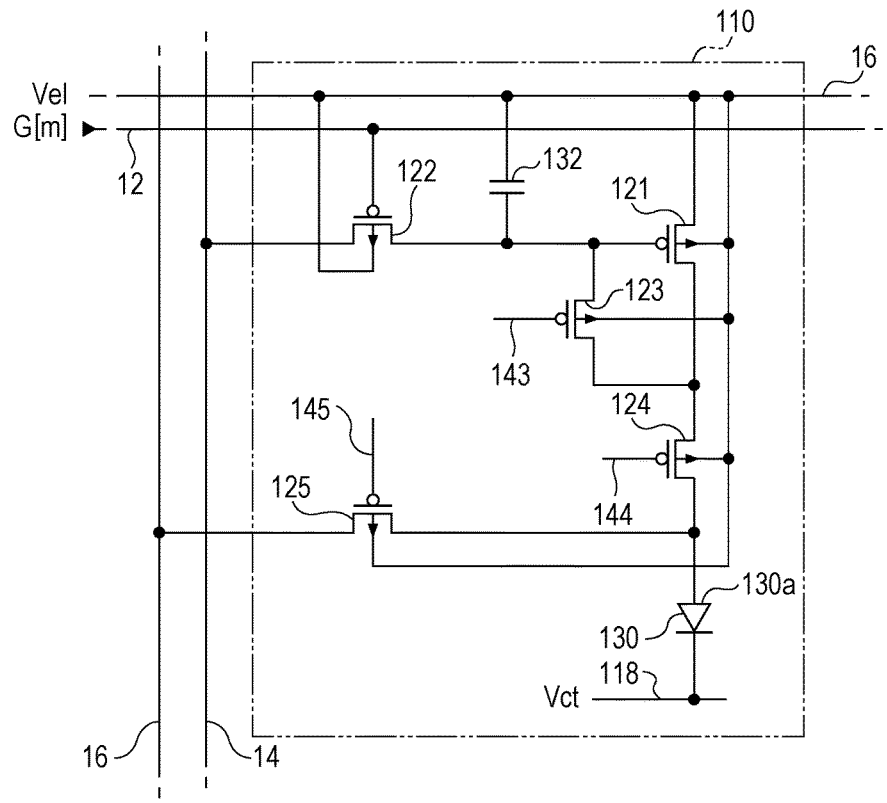
FIG. 21 is a diagram illustrating a pixel circuit in a light emitting device according to Modification Example 5.
Figure 22:
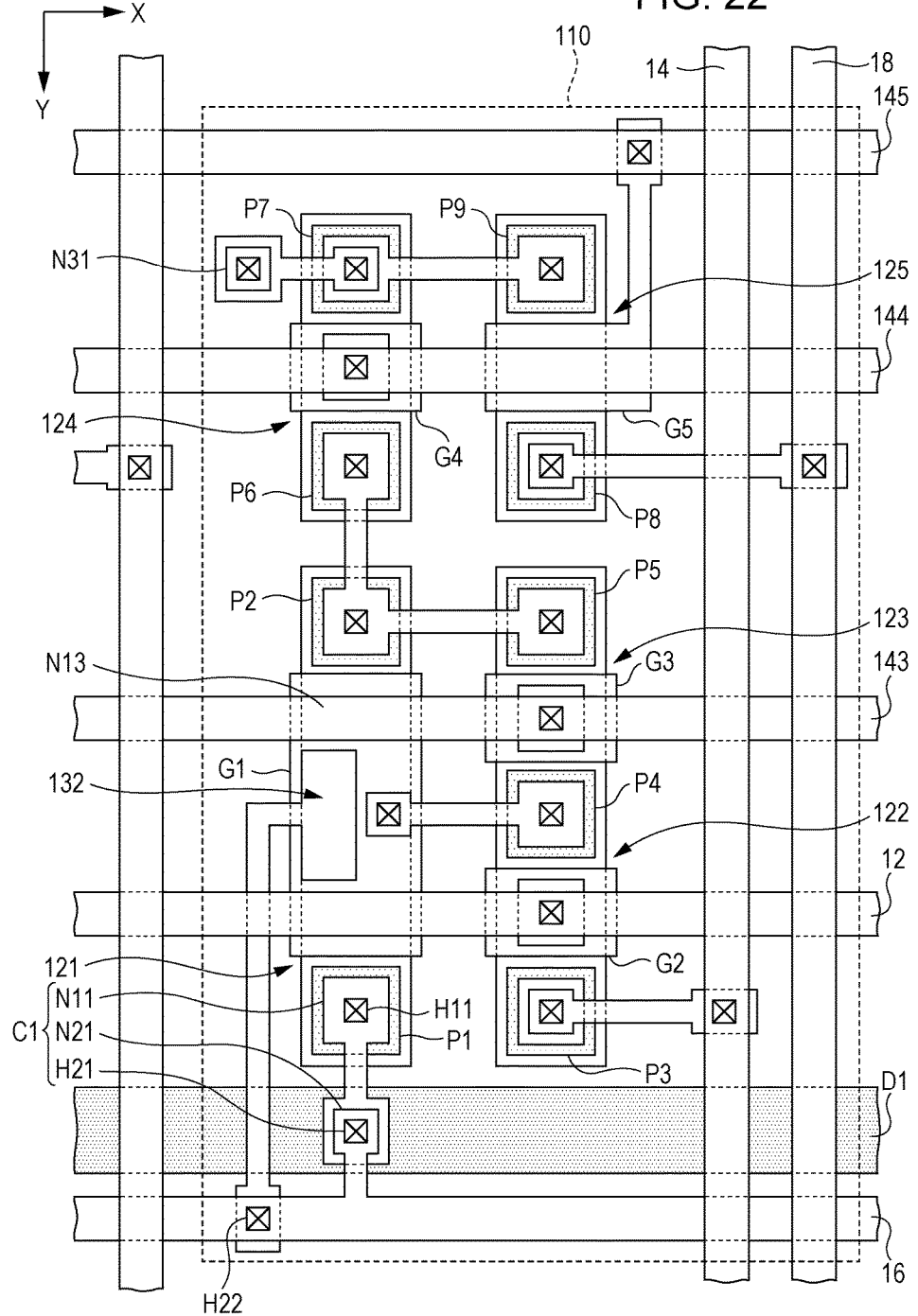
FIG. 22 is a top plan view illustrating a configuration of a pixel circuit in the light emitting device.

As shown in FIGS. 21 and 22, the pixel circuit 110 according to Modification Example 5 includes P-channel MOS-type transistors 121 to 125, the OLED 130, and the retentive capacitor 132. The substrate potentials of the transistors 121 to 125 are set to the electric potential Vel.

Further, in the display panel according to Modification Example 5, at each row, control lines 143 to 145 are provided. Through the control line 143, a control signal, which controls on and off of the transistor 123, is supplied from the driving circuit 30 to the gate of the transistor 123. Through the control line 144, a control signal, which controls on and off of the transistor 124, is supplied to the gate of the transistor 124. Through the control line 145, a control signal, which controls on and off of the transistor 125, is supplied to the gate of the transistor 125.

As shown in FIGS. 21 and 22, in a similar manner to the above-mentioned embodiments and modification examples, the transistor 122 includes the P-type impurity diffused region P3, the P-type impurity diffused region P4, and the gate node G2. The transistor 122 is provided between the data line 14 and the gate of the transistor 121 so as to control the electric connection between the gate of the transistor 121 and the data line 14.

In a similar manner to the above-mentioned embodiments and modification examples, the transistor 121 includes the P-type impurity diffused region P1, the P-type impurity diffused region P2, and the gate node G1. The source of the transistor 121 is electrically connected to the feeder wire 16, and the drain thereof is electrically connected to either one of the source or the drain of the transistor 123 and the source of the transistor 124. The transistor 121 functions as a driving transistor that flows current corresponding to the voltage between the gate and the source of the transistor 121.

The transistor 123 includes the P-type impurity diffused region P4, a P-type impurity diffused region P5, and a gate node G3. The transistor 123 is provided between the drain and the gate of the transistor 121 so as to control the electric connection between the drain and the gate of the transistor 121 on the basis of the control signal which is supplied through the control line 143.

The transistor 124 includes a P-type impurity diffused region P6, a P-type impurity diffused region P7, and a gate node G4. The transistor 124 is provided between the drain of the transistor 121 and the anode 130a of the OLED 130 so as to control the electric connection between the drain of the transistor 121 and the anode 130a on the basis of the control signal which is supplied through the control line 144.

The transistor 125 includes a P-type impurity diffused region P8, a P-type impurity diffused region P9, and a gate node G5. The transistor 125 is provided between the anode 130a of the OLED 130 and the feeder wire 18, which is supplied with a reset electric potential Vorst, so as to control the electric connection between the anode 130a and the feeder wire 18 on the basis of the control signal which is supplied through the control line 145.

As shown in FIG. 22, the relay node N21, the interlayer connection portion H21, the relay node N11, and the interlayer connection portion H11 (refer to FIG. 7), which electrically connect the feeder wire 16 and the P-type impurity diffused region P1, correspond to the source electrode of the transistor 121. Further, the relay node N21, the interlayer connection portion H21, the relay node N11, and the interlayer connection portion H14 (refer to FIG. 7), which electrically connect the feeder wire 16 and the N-type impurity diffused region D1, correspond to the contact portion C1.

That is, in FIG. 22, in the feeder wire 16, the feeder wire 118, which supplies the electric potential Vel to the semiconductor substrate, corresponds to the "first wiring". The N-type impurity diffused region D1 corresponds to the "first impurity diffused region" which is supplied with the electric potential Vct in the semiconductor substrate. The contact portion C1, which electrically connects the feeder wire 16 and the N-type impurity diffused region D1, corresponds to the "first contact portion".

In addition, in the example shown in FIG. 22, all the transistors 121 to 125 in the pixel circuit 110 are formed as the P-channel type transistors. However, all the transistors may be formed as the N-channel type transistors, and the P-channel type and N-channel type transistors may be appropriately mixed therein.

Modification Example 6

In the above-mentioned embodiments and modification examples, the light emitting device is able to display three display colors of RGB. However, the invention is not limited to the embodiments, and the light emitting device may be able to display a single color or a plurality of display colors. For example, the light emitting device may be able to display four display colors including a white color (W) in addition to RGB.

Modification Example 7

In the above-mentioned embodiments and modification examples, the feeder wire 41 is formed of the plurality of conductive wiring layers, but may be formed of a single conductive wiring layer.

Further, in the above-mentioned embodiments and modification examples, in the light emitting device, the feeder wires 41, N-type impurity diffused regions D2, and the contact portions C2 are provided in the peripheral region 40, but do not have to be provided.

Modification Example 8

In the above-mentioned embodiments and modification examples, the control circuit 5 is separated from the display panel 2. However, the control circuit 5 and the display panel 2 may be formed on the same substrate. For example, the control circuit 5 may be integrated into the semiconductor substrate, together with the display region 10, the driving circuit 30, and the like.

Modification Example 9

The above-mentioned embodiments and modification examples exemplify the OLED which is a light emitting element as an electric optical element. However, a light emitting device such as an inorganic light emitting diode or an LED (Light Emitting Diode) may emit light with the luminance corresponding to the current.

G. Application Example

Next, an electronic apparatus, to which the light emitting device according to the embodiments or modification examples is applied, will be described.

Figure 23:
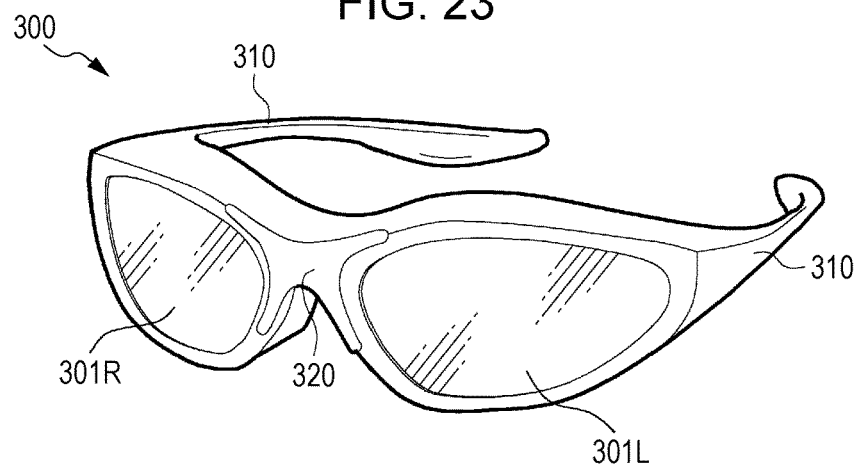
FIG. 23 is a perspective view of an electronic apparatus (HMD).
Figure 24:
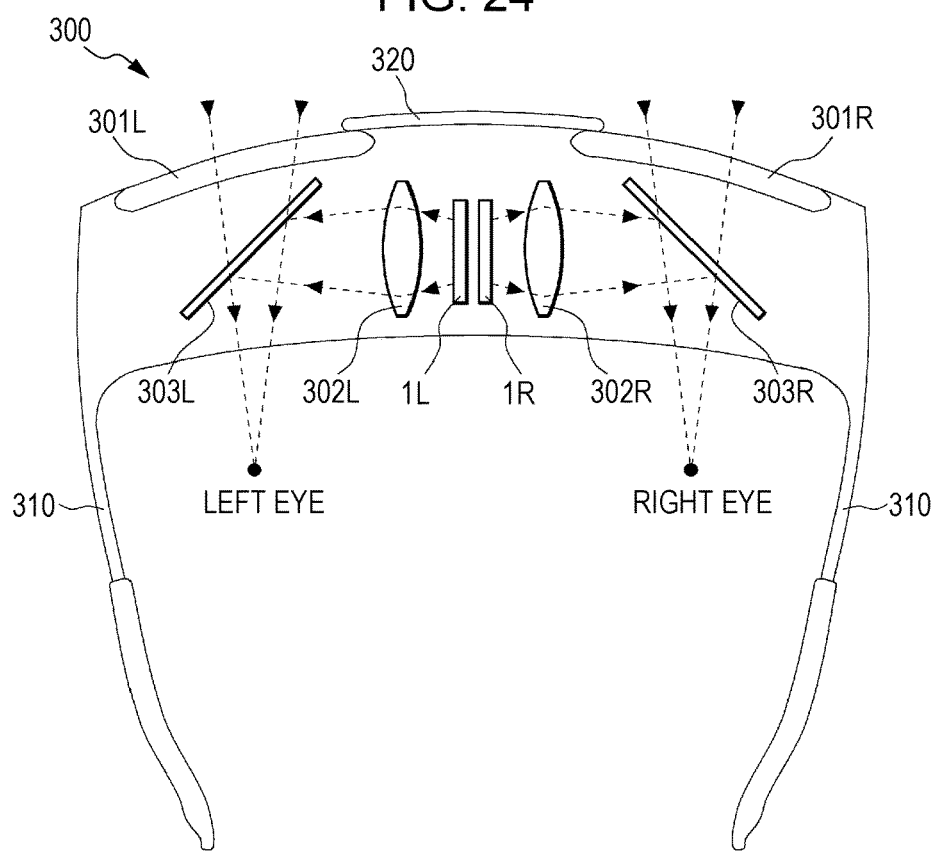
FIG. 24 is a diagram illustrating an optical configuration of the HMD.

FIG. 23 is a diagram illustrating an appearance of a head mount display. FIG. 24 is a diagram illustrating an optical configuration. First, as shown in FIG. 23, the head mount display 300 has temples 310, a bridge 320, and lenses 301L and 301R like normal glasses in appearance. Further, in the head mount display 300, as shown in FIG. 24, a light emitting device 1L for the left eye and a light emitting device 1R for the right eye are provided inside (the lower side of the drawing) the lenses 301L and 301R near the bridge 320. The image display surface of the light emitting device 1L is disposed on the left side of FIG. 24. Thereby, the display image provided by the light emitting device 1L is emitted in a direction of 9 o'clock of the drawing through the optical lens 302L. A half mirror 303L reflects the display image, which is emitted by the light emitting device 1L, in a direction of 6 o'clock, while transmitting light which is incident from a direction of 12 o'clock. The image display surface of the light emitting device 1R is disposed on the right side opposite to the light emitting device 1L. Thereby, the display image provided by the light emitting device 1R is emitted in a direction of 3 o'clock of the drawing through the optical lens 302R. The half mirror 303R reflects the display image, which is emitted by the light emitting device 1R, in the direction of 6 o'clock, while transmitting light which is incident from the direction of 12 o'clock.

In this configuration, a wearer of the head mount display 300 is able to view the display images provided by the light emitting devices 1L and 1R as a see-through image in which the display images are superimposed with an outside image. Further, in the head mount display 300, between both eye images having parallax, the left eye image is displayed by the light emitting device 1L, and the right eye image is displayed by the light emitting device 1R, whereby the wearer is able to view the displayed images with 3D depth perception (3D display).

Figure 25:
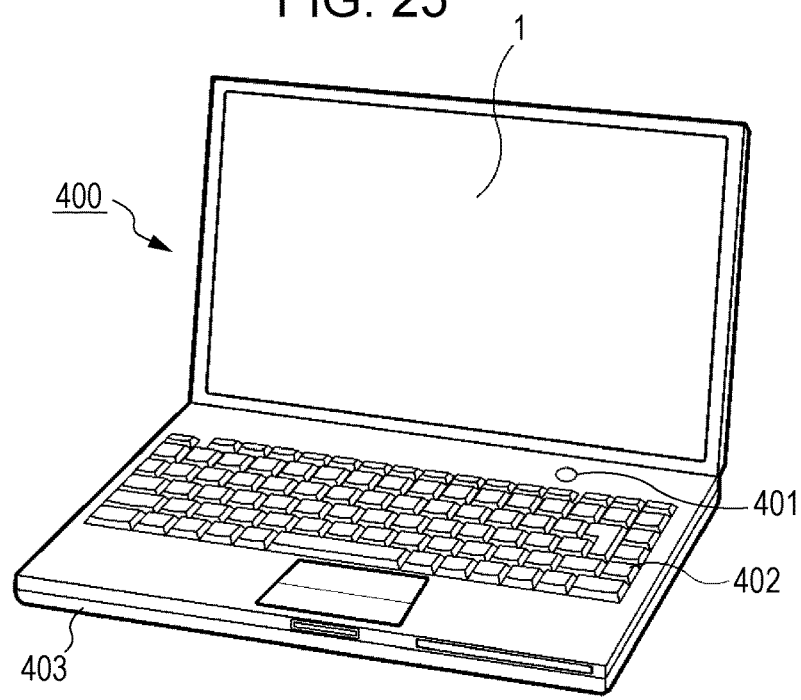
FIG. 25 is a perspective view of an electronic apparatus (personal computer).

FIG. 25 is a perspective view of a portable personal computer which employs the light emitting device according to the embodiments or modification examples. The personal computer 400 includes a light emitting device 1 which displays various images and a main body unit 403 which is provided with a power supply switch 401 and a keyboard 402.

Figure 26:
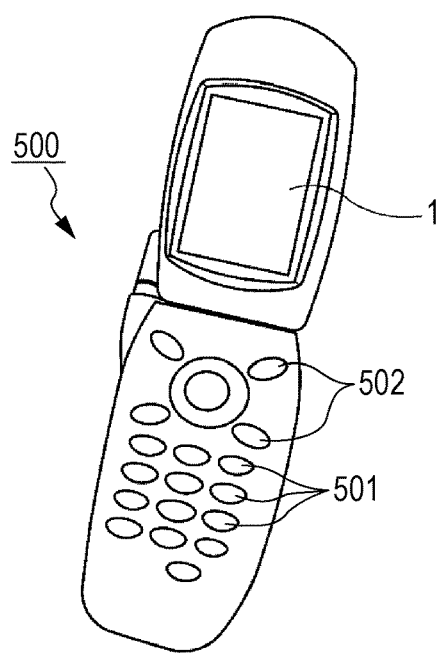
FIG. 26 is a perspective view of an electronic apparatus (mobile phone).

FIG. 26 is a perspective view of a mobile phone to which the light emitting device according to the embodiments or modification examples is applied. The mobile phone 500 includes a plurality of operation buttons 501, scroll buttons 502, and the light emitting device 1 which displays various images. By operating the scroll buttons 502, a screen displayed on the light emitting device 1 is scrolled.

In addition, examples of the electronic apparatus, to which the light emitting device according to the embodiments of the invention is applied, include not only the exemplary devices shown in FIGS. 23 to 26 but also include a portable information terminal (PDA: Personal Digital Assistant), a digital still camera, a television, a video camera, a car navigation apparatus, an on-board display (instrument panel), an electronic notepad, electronic paper, a calculator, a word processor, a workstation, a television phone, a POS terminal, a printer, a scanner, a copier, a video player, devices having a touch panel, and the like.

What is claimed is:

1. A light emitting device comprising:
   a semiconductor substrate;
   a pixel region of the semiconductor substrate;
   a plurality of first contact portions, each formed of a conductive material so as to connect the semiconductor substrate and the first wiring, the plurality of first contact portions being disposed in the pixel region;
   a plurality of pixel circuits, each disposed in the pixel region and having:
      a light emitting element;
      a first transistor for supplying a current to the light emitting element;
      a transistor impurity diffused region associated with the first transistor; and
      a source of each first transistor that is connected to one of the plurality of first contact portions;
   a first wiring that is formed of a conductive material and configured to be supplied with a predetermined electric potential, the first wiring being disposed in the pixel region; and
   a first impurity diffused region that connects the plurality of first contact portions to the semiconductor substrate, the first impurity diffused region being different from each transistor impurity diffused region, having impurities diffused throughout, having a longest dimension that extends parallel to a longest dimension of the first wiring, and being provided in a one-to-one correspondence with the first wiring.

2. An electronic apparatus comprising the light emitting device according to claim 1.

3. The light emitting device according to claim 1, wherein
   the light emitting device is able to display a first color and a second color,
   the plurality of pixel circuits includes a first display block corresponding the first color and a second display block corresponding the second color,
   each of the first display block and the second display block includes two pixel circuits,
   the first display block includes a first pixel circuit, and the second display block includes a second pixel circuit.

4. An electronic apparatus comprising the light emitting device according to claim 3.

5. The light emitting device according to claim 1, wherein one of the plurality of first contact portions includes a part of a source electrode of the first transistor.

6. An electronic apparatus comprising the light emitting device according to claim 5.

7. The light emitting device according to claim 1, wherein
   the pixel region includes a first unitary display region and a second unitary display region,
   an area of the first unitary display region is equal to an area of the second unitary display region, and
   the plurality of first contact portions includes a contact portion formed in the first unitary display region and a contact portion formed in the second unitary display region.

8. An electronic apparatus comprising the light emitting device according to claim 7.

9. The light emitting device according to claim 7, wherein
   the light emitting device is able to display a first color and a second color,
   the plurality of pixel circuits includes a first display block corresponding the first color and a second display block corresponding the second color,
   each of the first display block and the second display block includes two pixel circuits, and
   the first display block is disposed in the first unitary display region.

10. An electronic apparatus comprising the light emitting device according to claim 9.

11. The light emitting device according to claim 1, wherein
   the plurality of pixel circuits is disposed in a matrix, and
   the plurality of first contact portions is disposed in a matrix with a proportion of one row of first contact portions to two rows of the pixel circuits or with a proportion of one column of first contact portions to two columns of the pixel circuits.

12. An electronic apparatus comprising the light emitting device according to claim 11.

13. The light emitting device according to claim 1, further comprising:
   a second wiring that is formed of a conductive material and configured to be supplied with the predetermined electric potential; and
   a plurality of second contact portions, each formed of a conductive material and configured to connect the semiconductor substrate and the second wiring,
   wherein the plurality of second contact portions and the second wiring are provided in an arrangement region, and
   the arrangement region is a part or an entirety of a peripheral region surrounding the display region.

14. An electronic apparatus comprising the light emitting device according to claim 13.

15. The light emitting device according to claim 13, wherein the second wiring includes a plurality of conductive wiring layers.

16. An electronic apparatus comprising the light emitting device according to claim 15.

17. The light emitting device according to claim 13, wherein the semiconductor substrate includes a second impurity diffused region in the peripheral region, and the plurality of second contact portions is connected to the second impurity diffused region.

18. An electronic apparatus comprising the light emitting device according to claim 17.

19. A light emitting device comprising,
a semiconductor substrate;
a pixel region of the semiconductor substrate;
a first wiring that is formed of a conductive material, is configured to be supplied with a predetermined electric potential, is provided in the pixel region, and extends in a direction;
a plurality of first contact portions, each formed of a conductive material, the plurality of first contact portions being configured to connect the semiconductor substrate and the first wiring and being provided in the pixel region;
a plurality of pixel circuits disposed in a matrix in the pixel region, the plurality of pixel circuits including a plurality of sets of two pixel circuits, each set being formed of:
    a second pixel circuit having a light emitting element, a second transistor, a second transistor impurity diffused region associated with the second transistor, and a second source electrode of the second transistor that is connected to one of the plurality of first contact portions; and
    a third pixel circuit having a light emitting element, a third transistor and is next to the second pixel circuit in a row direction or a column direction, a third transistor impurity diffused region associated with the third transistor, and a third source electrode of the third transistor that is connected to one of the plurality of first contact portions; and
a first impurity diffused region that connects the plurality of first contact portions to the semiconductor substrate, the first impurity diffused region being different from each second transistor impurity diffused region and third impurity diffused region, having impurities diffused throughout, having a longest dimension that extends parallel to a longest dimension of the first wiring, and being provided in a one-to-one correspondence with the first wiring.

20. An electronic apparatus comprising the light emitting device according to claim 19.

* * * * *